(12) United States Patent
Barkan

(10) Patent No.: US 6,396,422 B1
(45) Date of Patent: May 28, 2002

(54) METHODS FOR QUANTIZING AND COMPRESSING DIGITAL IMAGE DATA

(75) Inventor: Stanley Barkan, Hof Hacarmel (IL)

(73) Assignee: Creoscitex Corporation Ltd., Herzlia (IL)

( * ) Notice: Subject to any disclaimer, the term of this patent is extended or adjusted under 35 U.S.C. 154(b) by 0 days.

(21) Appl. No.: 09/587,185

(22) Filed: Jun. 5, 2000

(51) Int. Cl.$^7$ .................................................. H03M 3/00

(52) U.S. Cl. ........................................................ 341/76

(58) Field of Search ............................. 341/50, 76, 143; 382/250; 711/211

(56) References Cited

U.S. PATENT DOCUMENTS

| | | | |
|---|---|---|---|
| 5,481,737 A | * 1/1996 | Ito | 711/211 |
| 5,680,129 A | 10/1997 | Weinberger et al. | |
| 5,822,461 A | * 10/1998 | Choi | 382/250 |
| 5,835,034 A | 11/1998 | Seroussi et al. | |

OTHER PUBLICATIONS

Theuwissen, A.J.P., "Solid–State Imaging with Charge–Coupled Devices", Kluwer (1995), sections 3.4 and 8.1.

T.D. Tran and R. Safranek, "A Locally Adaptive Perceptual Masking Threshold Model For Image Coding," Proc. IEEE Int. Conf. on Acoustics, Speech and Signal Processing, vol. IV, pp. 1882–1885, Atlanta, May 1996.

Wu "Lossless Compression of Continuous–Tone Images Via Context Selection, Quantization and Modelling", IEEE Transactions on Image Processing, vol. 6, No. 5, May 1997.

Al–Shaykh, O.K. and Mersereau, R.M., "Lossy Compression of Noisy Images", IEEE Trans. Image Processing, vol. 7, No. 12, Dec. 1998.

Wilks, S.S., "Mathematical Statistics", John Wiley (1962).

Fairchild, M.D., "Color Appearance Models", Addison–Wesley (1998), Chapter 3.9 (entitled: Color–difference Specification).

Jain, A.K., "Fundamentals of Image Processing", Chapter 11, Prentice–Hall (1989).

Sharma, D.J., "Design of Absolutely Optimal Quantizers for a Wide Class of Distortion Measures", IEEE Trans. Information Theory, vol. IT–24, No. 6, Nov. 1978.

Zamir, R. and Feder, M., "Information Rates of Pre/Post–Filtered Dithered Quantizers", IEEE Trans. Information Theory, vol. IT–42, No. 5, Sep. 1996.

* cited by examiner

Primary Examiner—Brian Young
(74) Attorney, Agent, or Firm—Eitan, Pearl, Latzer & Cohen-Zedek

(57) ABSTRACT

There are disclosed methods for quantizing image data with signal-dependent noise to a fewer number of values so that noise information is discarded while signal information is maintained. This is achieved by deriving a set of equations, the solution to which may be numerically computed and whose solution constitutes an optimal relative mean square error quantization for a signal with noise. Two low complexity explicit heuristic formulas for quantization are also provided. Also disclosed are methods for compressing image files containing signal dependent noise by means of near lossless compression so as to maintain signal information in the compressed data while discarding noise information, and methods for compressing multi-component color image data so that psycho-visually significant color information is maintained in the compressed data while other color information is discarded and a method for compressing multi-component color image data which is linearly proportional to high dynamic range light intensities so that color information significant for display and printing is maintained in the compressed data while other color information is discarded.

22 Claims, 10 Drawing Sheets

METHODS FOR QUANTIZING AND COMPRESSING DIGITAL IMAGE DATA

FIELD OF THE INVENTION

The present invention relates to the quantization and compression of digital image data, and more specifically to image data containing inherent signal dependent noise and color digital image data.

BACKGROUND OF THE INVENTION

Digital images contain huge amounts of data, especially for high quality display and printing. Compression is useful to reduce the time for transferring data in networks and for saving digital media storage space. Images may be monochromatic or colored and colored images may have two or more channels. The most common, images are RGB images (for display) and CMYK images (for print). The common source of most images is an input device such as a scanner or digital camera. Such input devices are two-dimensional instances of the class of applications where signal is captured by a light-sensitive device.

In video capture, digital photography and digital scanning, the image is acquired by means of an electronic sensor such as a charge-coupled device (CCD) or a complimentary metal-oxide semiconductor (CMOS) device with cells sensitive to electromagnetic radiation such as visible light, infrared or ultra-violet waves. In medical or astronomical imaging, images may also be acquired by X-ray, microwave or radiowave sensitive detectors. Such images will have inherent characteristic noise that is not a part of the original signal reaching the sensor.

A typical noise characteristic, as found in particle-counting devices, such as a CCD sensor, is mainly a combination of 'dark current' shot noise and photon shot noise. CCD noise characteristics are described in Theuwissen, A. J. P, "Solid-State Imaging with Charge-Coupled Devices", Kluwer (1995), sections 3.4 and 8.1, incorporated by reference herein. Dark current shot noise is constant for all light levels and is therefore significant at low light levels, whereas photon shot noise is proportional to the square root of the light level and is therefore most significant at high light levels.

In most electronic light sensing devices, such as video cameras for example, photon shot noise is largely eliminated from the output by use of a logarithmic or similar analog amplifier placed before the analog-to-digital (A–D) converter. Differences due to noise of the order of the square root of the incident signal level are thereby compressed into a nearly noiseless signal. Such non-linear compression of image signals causes little loss of visual quality because of the way the human eye interprets images. Specifically, in this cases the dynamic range of the original lighting is usually many orders of magnitude larger than the dynamic range of the projection or display device. Since the human eye is non-linear, in fact close to logarithmic, in its response to different dynamic ranges, the original signal would have to be non-lineally compressed for viewing or printing, after A–D conversion, to maintain subjective fidelity.

In modern digital cameras and scanners, such as the Leaf Volare and the EverSmart Supreme scanner, both devices available from Scitex Corporation, Herzlia, Israel, the CCD signals are converted to 14 or more bit data without non-linear, analog amplification. Thus the digitized data is directly proportional to the number of electrons captured by the sensing device. In this case there is inherent characteristic noise in the digital data. It is foreseeable that other devices such as, for example, medical or astronomical devices will also make the change to digitizing data without non-linear amplification. Many-bit files are large and require extensive storage space. It is therefore desirable to compress the data, provided there will be little or no loss of signal information.

The need to compress has also arisen for high-quality, multi-component images such as RGB images (for display) or CMYK images (for print), consisting of 8 (eight) bits per component. If the origin of the data is captured light intensities as in scanners or digital cameras, the data are transformations of the original light intensities, designed to allow display or printing of the image in a visually optimal manner. With the proliferation of such images and the increase in digital communication, a need has arisen to compress them for transmission and storage.

The most common means for compressing multi-component images is by use of the JPEG standard. The JPEG standard is described in international standard IS 10918-1 (ITU-T T.81), available from the Joint Photographic Experts Group, http.//www.jpeg.org.

The lossy JPEG standard is a method that compresses images by impairing high frequency data that are not noticeable to the eye. Improvements of lossy JPEG have also been suggested which utilize subtler psychovisual criteria. A summary is provided in T. D. Tran and R. Safranek, "A Locally Adaptive Perceptual Masking Threshold Model For Image Coding," Proc. IEEE Int Conf. on Acoustics, Speech, and Signal Processing, Vol. IV, pp. 1882–1886, Atlanta, May 1996. These improvements are intra-component additions. No use is made of inter-component, i.e. color, information.

JPEG compression can optionally utilize a color psychovisual criterion in case of compression of an RGB image. A matrix transformation can be applied to the RGB value to yield a luminance component and two color components. Then the color components can be optionally sampled at half the rate of the luminance component in the subsequent compression processing and the quantization tables for luminance and color may be different. This is in accordance with the fact that the human eye perceives color at less resolution than luminance.

The described procedure is however not optimal in three senses. First, the matrix transformation does not map the RGB image to a psychovisually uniform space if the RGB data are proportional to actual light intensities. Only if the RGB are logarithmic or power transformations of light intensities, is the image of the mapping approximately psychovisual and then only in the luminance component. Second, the lower rate of sampling of the color components completely eliminates color modulation of more than half the original frequency. Thirdly, the transformation cannot be used for color spaces with more than three components, such as CMYK data.

In addition lossy JPEG does not have the property that once-compressed and twice-compressed images are identical. This is desirable for applications where the file needs to be compressed and decompressed several times. Also JPEG compression cannot guarantee a maximum deviation of a decompressed pixel from the original pixel.

As an alternative to JPEG, digital image data may be losslessly or nearly losslessly compressed by a variety of compression algorithms. Fast and proven effective methods, especially tuned to compress images effectively, are described in U.S. Pat. Nos. 5,680,129 (Weinberger, et al.) and U.S. Pat. No. 5,835,034 (Seroussi, et al.). The methods disclosed in these patents form the basis for the draft standard JPEG-LS of ISO, ISO/IEC JTC1/SC29 WG1 (JPEG/JBIG) "Information Technology—Lossless and Near-Lossless Compression of Continuous-Tone Still Images, Draft International Standard DIS14495-1 (JPEG-LS)"(1998) (hereinafter referred to as "Draft International Standard DIS14495-1"), incorporated by reference herein, and attached hereto as Addendum I.

Another lossless/near-lossless method for images is described in Wu, "Lossless Compression of Continuous-Tone Images Via Context Selection, Quantization And Modeling", IEEE Transactions on Image Processing, Vol. 6, No. 5, May 1997.

The above methods are both differential pulse code modulation (DPCM) techniques. DCPM is a general signal compression technique based on the formulation of predictors for each signal value from nearby values, The difference between the predicted value and the true value is encoded. DPCM techniques in general and for images in particular, are described in Jain, A. K., "Fundamentals of Image Processing", Chapter 11, Prentice-Hall (1989), the entire work incorporated by reference herein.

DPCM techniques do not give good compression ratios in the presence of small variations in the data such as noise, since the performance of the predictors degrades. To increase the compression ratio, nearly lossless methods may be used.

Nearly lossless encoding with DPCM techniques is performed by uniform quantization of the prediction error using fewer values than required. For example, instead of using the full 511 values $\{-255, \ldots, 0, \ldots, +255\}$ required for 8 bit data errors, 200 values with a suitable rule for encoding and decoding of the coarsely quantized differences can be used.

When quantizing a signal sequence, optimal quantization for a given distortion measure can be achieved if the characteristic frequency distribution of the values in a typical sequence is known. The optimal minimum mean square error quantizer is known as the Lloyd-Max quantizer. The Lloyd-Max quantizer is described in Jain (above) A common assumption for photographic images is uniform frequency over all values. For uniform signal value distribution, the Lloyd-Max quantizer leads to uniform quantization with all quantization intervals having equal size.

A general method for finding the optimal quantizer for data using a distortion measure based on the quantization error and the observed value is given in Sharma, D. J., "Design of Absolutely Optimal Quantizers for a Wide Class of Distortion Measures", IEEE Trans. Information Theory, Vol. IT-24, No. 6, November 1978. Quantization schemes for non-Gaussian sources and sources that have undergone transformations or have been converted to predictions are discussed in Zamir, R. and Feder, M., "Information Rates of Pre/Post-Filtered Dithered Quantizers", IEEE Trans. Information Theory, Vol. IT-42, No 5, September 1996.

In all the above quantizing schemes, the criterion for finding the quantizer is based on the error between the quantized signal and the observed signal. These methods are also valid when the observations suffer from noise that is not dependent on the amplitude of the signal. However, for signals with inherent signal-dependent noise, a desirable criterion for quantizing should take into account the error between the quantized signal and the actual (unobserved) signal that gave rise to the observation. The above quantizers are not optimal for data with noise that is signal dependent when the criterion for quantization is a function of the difference between the actual unobserved signal and the quantized observation. In particular, use of the above quantizers for quantizing the difference between predictor and observed value in DPCM techniques is not optimal for data with signal dependent: noise using such a criterion.

Al-Shaykh,O. K. and Mersereau, R. M., "Lossy Compression of Noisy Images", IEEE Trans. Image Processing, Vol. 7, No. 12, December 1998, have suggested a method for quantization wherein the image data is corrected by a mean square error estimate and subsequently quantized with a Lloyd-Max quantizer. This is optimal according to a certain criterion. This method does not, however, guarantee a maximum deviation. It also implies that the quantization, after estimation, is uniform for arbitrary images, unless the images are processed twice, once for statistics and a second time for the quantization. This particular solution is dictated by the choice of optimality criterion. It would be advantageous to find a different, justifiable criterion leading to a non-uniform quantization with better potential compression ratio, while still guaranteeing a maximum deviation.

FIG. 1 shows the basic building blocks of a signal capture device 5 having a radiation-sensitive sensor 20. The radiating or reflecting source 10 is imaged through the optics 15 of the capture device onto the focal plane of the sensor 20. The incident radiation causes a voltage to be generated in the sensor that is read by the electronic circuitry 25 and converted to a digital number by the analog to digital converter (A–D converter) 30. The value provided by the A–D converter 30 is transferred to computer memory 35 where it represents the light or other radiation captured on the sensor corresponding to a specific location in the original radiating or reflecting source.

FIGS. 2A–2D show examples of different types of sensors. The photomultiplier tube 40 is found in commercial drum scanning devices such as the Heidelberg Tango scanner, available from Heidelberg Druckmaschinen AG of Heidelberg, Germany. The one-dimensional CCD array 45 is found in commercial flat bed scanning devices such as the aforementioned Scitex EverSmart Scanner. The two-dimensional CCD array 50 is found in modern digital still cameras, such as the Leaf Volare. The two-dimensional CCD array may have a mosaic pattern of color filters 55 deposited on the array to provide a basis for color images. The repeating color pattern 55 is sometimes referred to as the Bayer mosaic pattern.

As mentioned above the two primary sources of noise in a radiation-sensing device are dark current shot noise and photon shot noise. Photon shot noise depends on the number of photons captured at a site 52 in the sensor array 50 while dark current shot noise depends on the degree of spontaneous noise generated by. undesired current present at the sensing site 52, independent of the amount of radiation incident on it.

Both of these types of noise may be approximately modeled by a Poisson probability distribution. Poisson probability distributions are described in Wilks, S. S., "Mathematical Statistics", John Wiley (1962).

For photon shot noise, the mean and variance of the observed value x at a site are the actual signal value s. For dark current noise the mean and variance of the distribution are a temperature-dependent value a which is independent of the incident signal. The total noise then causes the observed value x to have a Poisson distribution $P(X=x|S=s)$ abbreviated $P(x|s)$ with mean and variance, expressed as $s+\alpha$.

If the sensing device has circuitry which performs a non-linear transformation $f(x)$ on the observed value x, the transformation may be known or measured by experiment and the noise distribution $P(f(x)|s)$, its mean and its variance may be computed by elementary statistical methods such as described in Wilks, "Mathematical Statistics" (above).

It would be desirable when compressing signals having inherent noise to throw away information about the noise while retaining information about the signal.

With reference to captured signals that result in images for display (RGB) or print (CMYK), the above mentioned prior-art quantizers do not take into account important psychophysical effects. They may allocate more bits to colors that the eye can barely distinguish than to colors the eye sees as significantly different. In particular, use of the above quantizers for quantizing the difference between predictor and observed value in DPCM techniques is not optimal for image data if the distortion measure includes a psychophysical criterion.

Also, the above quantizers do not take into account the transformation applied to many-bit files before representing them in display or print medium. As mentioned above, many-bit files are often linearly proportional to light intensities which may have much larger dynamic range than the display or print medium. In such cases the data will be non-linearly transformed at a subsequent stage to correctly represent original intensities in the reduced range medium. These transformations are often of the gamma type, i.e. raising the signal to a given exponent, often close to $\frac{1}{3}$. Thus use of the above quantizers for quantizing the difference between predictor and observed value in DPCM techniques is not optimal for data that are destined to undergo non-linear transformations.

The CIE 1976 (L*, a*, b*) color space, abbreviated CIELab, is a standard color space which is approximately uniform to human visual perception. This means that spatial distance between colors in CIELab space approximates the visual sensation of the difference between them. CIELab is described in Fairchild, M. D., "Color Appearance Models", Addison-Wesley (1998), Chapter 3.9 (entitled: Color-difference Specification), incorporated by reference herein. Tristimulus value space XYZ is a color space from which CIELab is derived. XYZ is also described in Fairchild, "Color Appearance Models" (above).

International Color Consortium (ICC) source profiles are used to describe the color of input devices such as digital cameras and scanners. ICC profiles are described in Fairchild, "Color Appearance Models" (above) and in the ICC specification "Spec ICC.1: 1998–09, File Format for Color Profiles", http://www.color.org, hereinafter "Spec ICC.1", incorporated by reference herein. The source profiles therein provide an approximate mapping between the RGB color space defined by the sensing device's spectral responses, in predefined lighting and subject matter setups, to a profile connection space which may be either tristimulus value space XYZ or CIELab space. ICC source profiles also provide a mapping from multi-component files such as CMYK files to XYZ or CIELab. For accurate profiles a three-dimensional lookup table is required. Since the ICC profile format permits such a table only when the profile connection space is CIELab, we assume this is the case.

ICC profiles are embedded in captured image files to provide for color consistency across color display and color printing devices. When a captured image file is to be viewed or printed, the image data are processed by first applying the source profile. The source profile maps the image data to the device-independent profile connection CIELab. Then, an output profile is applied that maps the CIELab data to the output color space. This may also be done by first concatenating the profiles and then applying the concatenated profile. In any case, all subsequent visible manifestations of the original captured image will have passed through the source profile mapping to CIELab. CIELab is thus the universal, standard, approximately psychovisually uniform space in which color is described according to current ICC specifications.

SUMMARY OF THE INVENTION

The present invention improves on and overcomes problems associated with the Conventional art. The invention provides a method for quantizing image data with signal-dependent noise to a fewer number of values so that noise information is discarded while signal information is maintained. This is achieved by deriving a set of equations, the solution to which may be numerically computed and whose solution constitutes an optimal relative mean square error quantization for a signal with noise. Two low complexity explicit heuristic formulas for quantization are also provided.

The invention also provides a method for compressing image files containing signal dependent noise by means of near lossless compression so as to maintain signal information in the compressed data while discarding noise information. This is achieved by integrating a new quantization method into a standard DPCM method for image compression. The new quantization method quantizes differences between a predictor and an actual value in a signal dependent manner so that the amount of quantization is proportional to the amount of noise in the signal, thus effecting relative uniform allocation of quantization error.

The invention also provides a method for compressing multi-component color image data so that psycho-visually significant color information is maintained in the compressed data while other color information is discarded and a method for compressing multi-component color image data which is linearly proportional to high dynamic range light intensities so that color information significant for display and printing is maintained in the compressed data while other color information is discarded. These methods are achieved by providing an explicit measure of deviation contributed by quantization of color differences, this measure expressed in terms of L, a and b values but computable in terms of the source data.

There is also provided a method for compression of multi-component color image files containing embedded ICC profiles in such away as to distribute distortion of the visual appearance of such data in predefined proportions across the source image components. This is achieved by integrating a new quantization method into a standard DPCM method for image compression. The new quantization method quantizes color differences between a predictor color and an actual color by means of the embedded source profile in a manner such that the error is psychovisually limited and distributed between the source components in predefined proportions.

Additionally, there are provided methods of compression and decompression that do not degrade the image by successive compression-decompression cycles but yield identical data for each cycle following the first cycle and methods of compression and decompression that guarantee the existence of a maximum deviation from the original. These compression and decompression methods are achieved by implementation of compression using the above quantization methods in embodiments of a generic DPCM nature. The DPCM technique ensures that second and further cycles of compression and decompression provide identical decompressed signals. Use of near lossless quantization ensures that the amount of quantization never exceeds a predetermined amount at any location.

The present invention is directed to a method for quantizing a signal having a signal dependent noise distribution. In this method, there includes the step of establishing a plurality of quantization levels, each of these quantization levels comprising left, right and representative values, and an interval length defined by the difference between said right and left values, such that at least one interval length is different from at least one other interval length, The left, right and representative values for each of said quantization levels are then adjusted such that for each interval, the interval length is correlated with the signal dependent noise distribution at the representative value.

There is also disclosed a method for quantizing a signal having a signal dependent noise distribution. This method involves the steps of establishing a plurality of quantization levels, each of these quantization levels comprising left, right and representative values, and an interval length defined by the difference between the right and left values. This is followed by computing the left, right and representative values for each of the quantization levels such that each pair of successive intervals is in accordance with the relation:

$$(T(k+1)-T(k))/(T(k)-T(k-1))=g[R[k]]/g[R[k-1]]$$

where:
$g[s]$ is the standard deviation of the noise distribution for signal amplitude s;
$R[i]$, i=1, . . . , L are said representative values; and
$T[i]$, $T[i+1]$ i=1, . . . , L are said left and right values corresponding to said representative value $R[i]$.

Also disclosed is a method for compressing a signal sequence having a signal dependent noise distribution, that includes the steps of establishing a plurality of quantization levels, each of the quantization levels comprising left, right and representative values, and an interval length defined by the difference between the right and left values, such that at least one interval length is different from at least one other interval length. The left, right and representative values for each of the quantization levels is then adjusted, such that for each of the intervals, the interval length is correlated with the signal dependent noise distribution at the representative values. The representative, left and right values for each interval are then encoded into a bit stream by means of an entropy encoder. For each obtained signal value S, predicted signal value SP is formed by means of predicted signal values preceding the signal value S in the sequence. The difference d between the predicted signal value SP and the signal value S is then computed. The difference d is divided by the length ILP of the intervals containing the predicted signal value SP to obtain quantized difference count QDC. The difference d is replaced with the said quantized difference count QDC, and the quantized difference QDC is encoded into the bit stream by means of an entropy encoder. The resultant bit stream is then saved.

There is also disclosed a method for quantizing the differences D between components of a first tuplet of color component values T1 and a second tuplet of color component values T2 from a first multi-component color space MCS1, using a mapping from the space MCS1 to a second multi-component color space MCS2 and a measure of distance DM2 in the space MCS2, the distance measure having a tuplet of gradients DM2DC with respect to the component directions in space MCS2. This comprises the steps of selecting a distance threshold DELTA2 in the space MCS2 and selecting a tuplet of weighting coefficients W for each component of the space MCS1. The tuplet T1 is mapped to the space MCS2 with the mapping from the space MCS1 to the space MCS2 to obtain tuplet T1—in M2. For each component in the space MCS2, the tuplet of gradients DM2DC of said measure of distance DM2 in space MCS2 with respect to each component direction in MCS2 at the tuplet T1—in M2 is evaluated. For each component in the space MCS1, the tuplet of gradients DT2DT1 of the mapping of space MCS1 with respect to each component direction in MCS2 at the tuplet T1 is evaluated. The scalar product SP2 of said tuplets DT2DT1 with said gradients DM2DC is computed. A tuplet QL of quantization lengths for the component directions in MCS1 such that the ratios R between all pairs of lengths in the tuplet QL is equal to the ratios between the corresponding pairs of weighting coefficients in said tuplet W is then established and the scalar product SP1 of the product SP2 with the tuplet QL computed. The tuplet QL is adjusted to obtain adjusted tuplet QL' such that the scalar product SP1 is equal to DELTA2 and the ratios R are unchanged. Each component of the differences D is divided by the corresponding component of the adjusted tuplet QL' to obtain nearest integral values INT. The integral values INT are then multiplied with corresponding components of the adjusted tuplet QL' to obtain quantized differences QD, and differences D are replaced by the quantized differences QD.

Finally, there is disclosed a method for compressing a color signal sequence in a first multi-component color space MCS1, having a mapping to a second multi-component color space MCS2 and a measure of distance D2 in said space MCS2. This method includes the steps of selecting a distance threshold DELTA2 in the space MCS2 and selecting a tuplet of weighting coefficients W for each component of the space MCS1. DELTA2 and the W are then encoded into a bit stream by means of an entropy encoder. For each multi-component signal tuplet S in the color signal sequence, a predicted signal tuplet PST of an actual signal tuplet T is formed by means of already coded signal tuplets preceding the actual signal tuplet T in the sequence. The differences D between the predicted signal tuplet PST and the actual signal tuplet are then computed and the tuplet PST to the space MCS2 are mapped with the mapping from the space MCS1 to the space MCS2 to obtain tuplet PSTinM2. For each component in the space MCS2, the tuplet of gradients DM2DC of the measure of distance DM2 in space MCS2 with respect to each component direction in MCS2 at the tuplet PST__in__M2 is evaluated and for each component in the space MCS1, the tuplet of gradients DT2DT1 of the mapping of space MCS1 with respect to each component direction in MCS2 at the tuplet T1 is evaluated. The scalar product SP2 of said tuplets DT2DT1 with said gradients DM2DC is then computed and a tuplet QL of quantization lengths for the component directions in MCS1 such that the ratios R between all pairs of lengths in said tuplet QL are equal to the ratios between the corresponding pairs of weighting coefficients in the tuplet W is established. The scalar product SP1 of said product SP2 with said tuplet QL is computed and the tuplet QL is adjusted to obtain adjusted tuplet QL' such that the scalar product SP1 is equal to the DELTA2 and the ratios R are unchanged. Each component of the differences D is divided by the corresponding component of the adjusted tuplet QL' to obtain nearest integral values INT, and integral values INT are encoded into a bit stream by means of an entropy encoder. The resultant bit stream is saved.

BRIEF DESCRIPTION OF THE DRAWINGS

Attention is now directed to the drawings where like numerals and characters identify corresponding or like components. In the drawings.

DETAILED DESCRIPTION OF THE DRAWINGS

Figure 1:
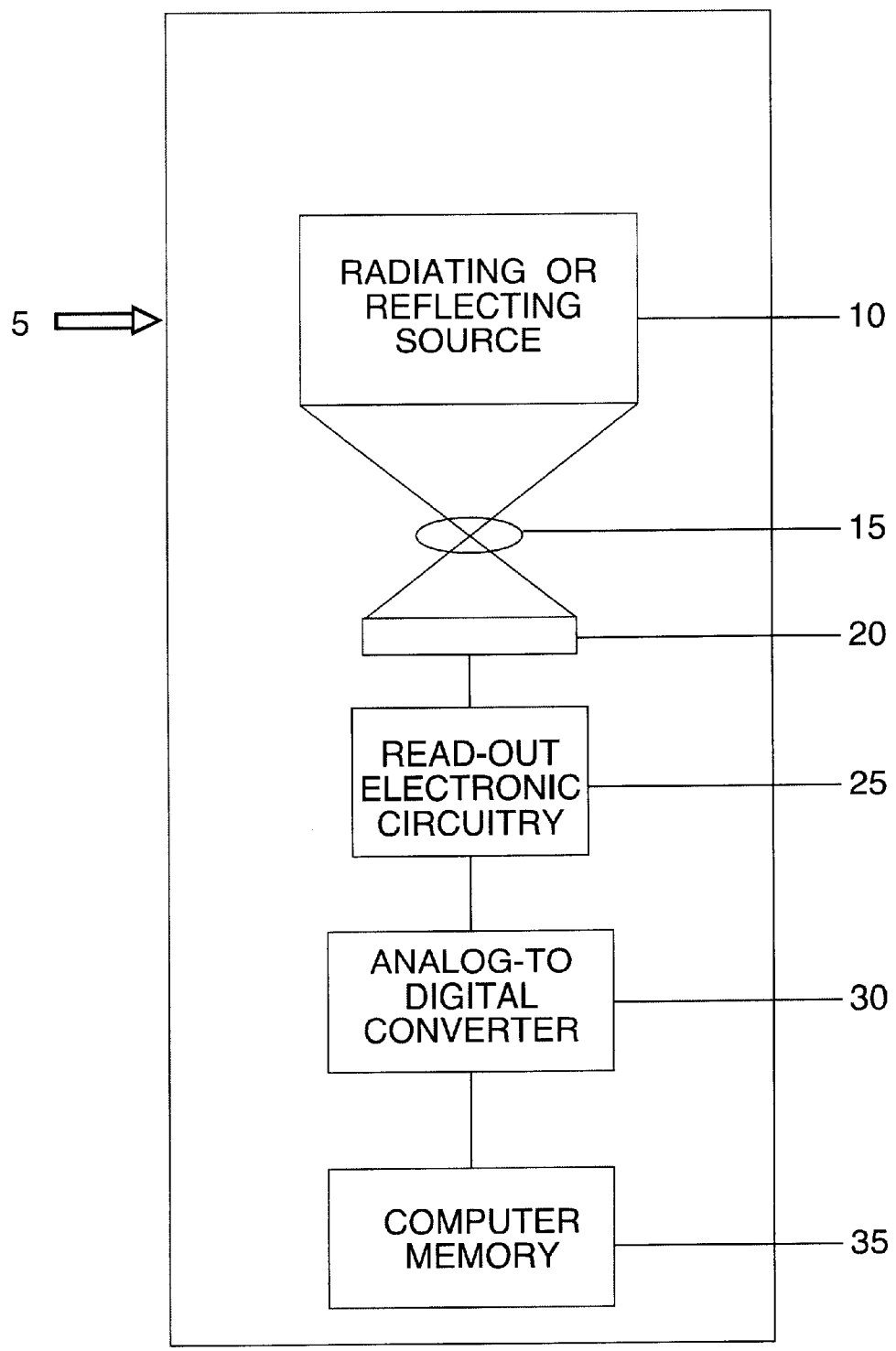
FIG. 1 is a schematic diagram of a capture device with a radiation-sensitive sensor.

Appendix A, as attached hereto, derives a method for computing an optimal relative mean square error quantization for a signal with noise. Relative mean square measures the error introduced by quantization relative to the error deriving from the noise inherent in the signal. A quantization is given by two sets of values $T=\{T(1),T(2),\ldots,T(L)\}$ and $R=\{R(1),R(2),\ldots,R(L)\}$ where L is the desired number of quantization levels, and 1. The quantization intervals are: $\{[T(i),T(i+1)); T(i)\epsilon T\ T(i+1)\epsilon T\}$
2. The representative quantized levels are: $\{R(i); T(i)<R(i)<T(i+1), T(i)\epsilon T, T(i+1)\epsilon T\}$ An optimal relative mean square error quantization for a signal with noise is given by finding T and R that satisfy the following two simultaneous equations:

$$r_k = \frac{\int_{t_k}^{t_{k+1}}\left(\int_s \frac{s}{g(s)}P_{x|s}(x|s)P_s(s)ds\right)dx}{\int_{t_k}^{t_{k+1}}\left(\int_s \frac{1}{g(s)}P_{x|s}(x|s)P_s(s)ds\right)dx}$$

$$= \frac{E_{s,x}\left[\frac{s}{g(s)}\bigg| x \in [t_k, t_{k+1})\right]}{E_{s,x}\left[\frac{1}{g(s)}\bigg| x \in [t_k, t_{k+1})\right]}$$

$$\frac{r_k + r_{k+1}}{2} = \frac{E_{s|t_k}\left[\frac{s}{g(s)}\bigg| t_k\right]}{E_{s|t_k}\left[\frac{1}{g(s)}\bigg| t_k\right]}$$

where $t_k$, $t_{k+1}$, $r_k$ are said left, right and representative values for the k'th interval of said plurality of intervals and $g(s)$ is the variance of said signal dependent noise at signal value s.

Without loss of generality, we assume that the actual signal s and the observation x are represented as integers between 0 and $(2^m)-1$ where m is the number of bits provided by the A–D converter 30 in the capture device 5. Iterative methods may be used to solve the above equations simultaneously, given the boundary values $T(1)=0$ and $T(L)=2^m$, dictated by the lowest and highest attainable values of the digitized signal. Newton-Raphson and other methods for solving systems of non-linear equations are discussed in "Numerical Recipes in C", Sections 9.6 and 9.7, http://www.ulib.org/webRoot/Books/Numerical_Recipes, this entire work incorporated by reference herein, and sections 7.2, 9.6, 9.7 and 20.5 attached hereto as Addendum II.

It will be appreciated by persons skilled in the art that images that have undergone known or experimentally determined non-linear transformations after capture, may also be processed by the preferred embodiment described above by simply replacing $P(x|s)$ by $P(f(x)|s)$. $P(f(x)|s)$ may be experimentally determined by repeatedly radiating a series of signals with various known amplitudes onto the sensor and measuring the variation between sensor readings for each signal amplitude. For convenience and without loss of generality, we will hereinafter consider images that have been captured without non-linear transformation so that the observation is assumed to be linear in the signal. The preferred embodiments described below may easily be extended to images captured with known non-linear transformations in the manner described above.

If the distribution of the noise inherent in the signal is known or has been experimentally determined, a preferred embodiment for computing quantization intervals by a computationally quick method is by construction of intervals each proportional in size to the standard deviation of the values in the interval. For signals that have undergone a non-linear transformation prior to or subsequent to digitization the distribution of the noise is understood to be the distribution of the noise after the transformation. Such a construction for non-uniform quantization may be performed in several ways. An example construction is described in Appendix B, attached hereto.

Often the standard deviation of the noise inherent in the signal is approximately proportional to a power of the observed value, as for example CCD noise, where the standard deviation of the noise is approximately proportional to the square root of the signal. In this case a preferred embodiment of this invention computes a set of quantization intervals by a computationally simple method.

Figure 3:
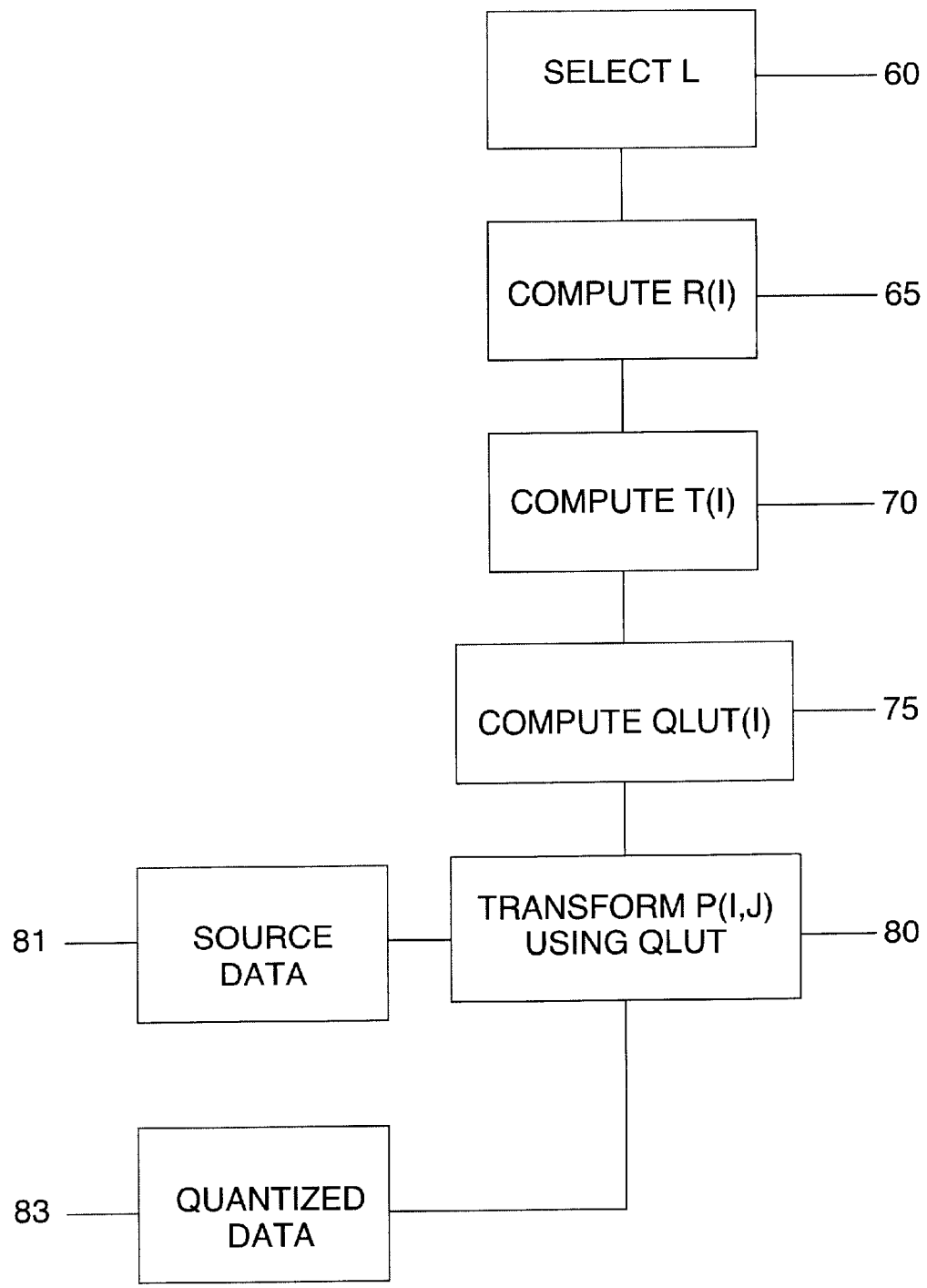
FIG. 3 is a schematic diagram of a method for non-uniform quantization.

FIG. 3 is a schematic diagram of a method for quantizing an image into L levels using a heuristic method wherein a uniform quantization is performed in an exponent space of the signal. An exponent can be selected that minimizes the relative mean square with respect to other possible exponents.

A non-uniform quantization $T=\{T(1), T(2), \ldots, T(L)\}$ and $R=\{R(1), R(2), \ldots, R(L)\}$ for L levels using the above mentioned heuristic is obtained by the following steps. In step 60 select a value for L. Care must be taken not to eradicate signal differences that are smaller than the value of the noise differences. This is controlled by ensuring a suitable ratio $L/2^m$. Selecting L such that the above ratio is 1/10 has proven satisfactory for images with m=14.

In step 65 compute the table of values R using the following formula:

$$R(i)=((i-0.5)*(1/L)^{(power)})*(2^m-1) \quad i=1,2 \ldots L$$

The parameter 'power' is a positive real number larger than or equal to 1.0. For 'power' equal to 1.0, the above quantization is the uniform quantization. For 'power'=1.5, this quantization has been found to minimize the relative mean square with respect to other possible exponents for a signal dependent Poisson distribution having approximate standard deviation $R(i)^{0.5}$ at observed value $R(i)$. Appendix C, attached hereto, provides an explanation and a numerical example.

In step 70 compute a table of values T using the following rule:

$$T(0) = 0$$

$$T(i) = (R(i) + R(i+1))/2 \quad i = 2, \ldots L-1$$

$$T(L) = 2^{\wedge}m - 1$$

In step 75 compute a quantization lookup table by the following procedure based on the quantization tables T and R computed above:

[0]=0;
for (i=1; i<2^m; i++)

```
{
    [i]=0;
    for (j=0;j<=L;j++)
    {
        if (T[j]>i)
        {
            [i]=R[j];
            break;
        }
    }
}
```

In step 80 each data value p[i][j] from source data 81 is converted by the transformation:

p[i][j]=[p[i][j]]

to give quantized data 83.

It will be appreciated by persons skilled in the art that steps 65 and 70 could be replaced with the procedure described in Appendix C, attached hereto.

It is possible to compress an image quantized by the above method using one of the above mentioned lossless schemes for image compression. However the histogram of values in the decompressed file will only have L distinct values among the $2^{\wedge}m$ possible values, namely the values $R(i)$. This contributes to posterization in the image. A method of compression yielding more than L distinct values is described in the embodiment below.

Figure 4:
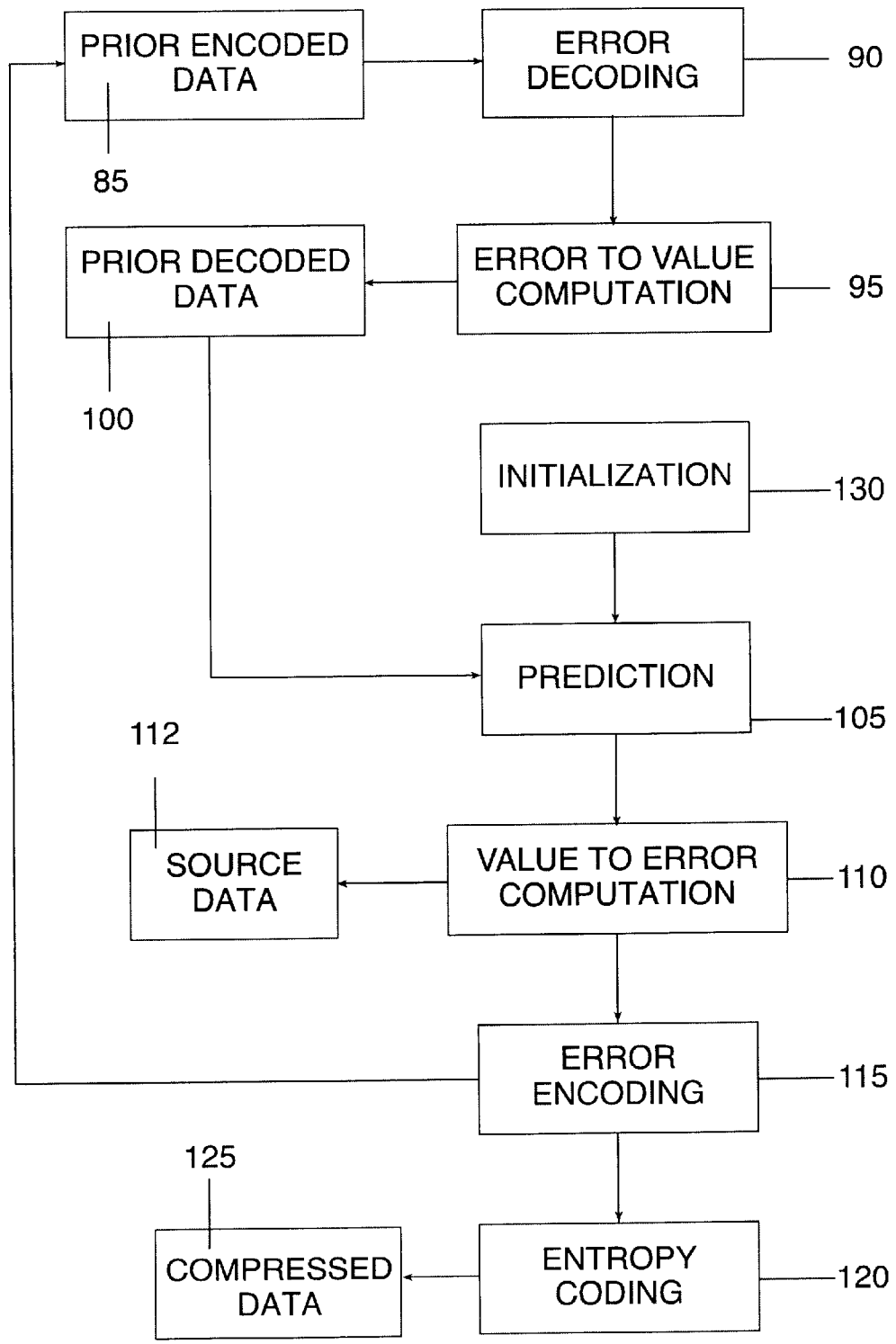
FIG. 4 is a schematic diagram of the central loop of a generic method for nearly lossless DPCM compression of images.

FIG. 4 is a schematic diagram of the central loop of a generic method for nearly lossless DPCM compression of images. Prior encoded data 85 to the left and above the current pixel are decoded in process 90 and the prior pixel values are computed in process 95 to provide prior decoded data 100. In nearly lossless encoding the decoded data 100 may not equal the actual original value but only a value close to it. The data 100 are used to predict the current pixel in process 105. The difference between the predicted value and actual value from source data 112 is computed in process 110 and the error encoded in process 115. The results of process 115 are appended to the prior encoded data 85 for encoding of subsequent pixels. The results of process 115 are also entropy encoded in process 120. The entropy-encoded data is appended to the compressed data 125 computed thus far. This process continues until all the data have been compressed. To complete the description it is only necessary to state how the initial pixel is predicted in initialization step 130. This can be done for example by including the actual first pixel value at the beginning of the compressed data and predicting the second pixel by means of the attached value.

In a first embodiment of the present invention, the prediction process 105 consists of predicting the value of a pixel by its immediate neighbor to the left and the entropy coding process 120 is performed by an arithmetic coder. Arithmetic coders are described in "Numerical Recipes in C" (referenced above), section 20.5 (attached hereto in Addendum II).

Figure 5:
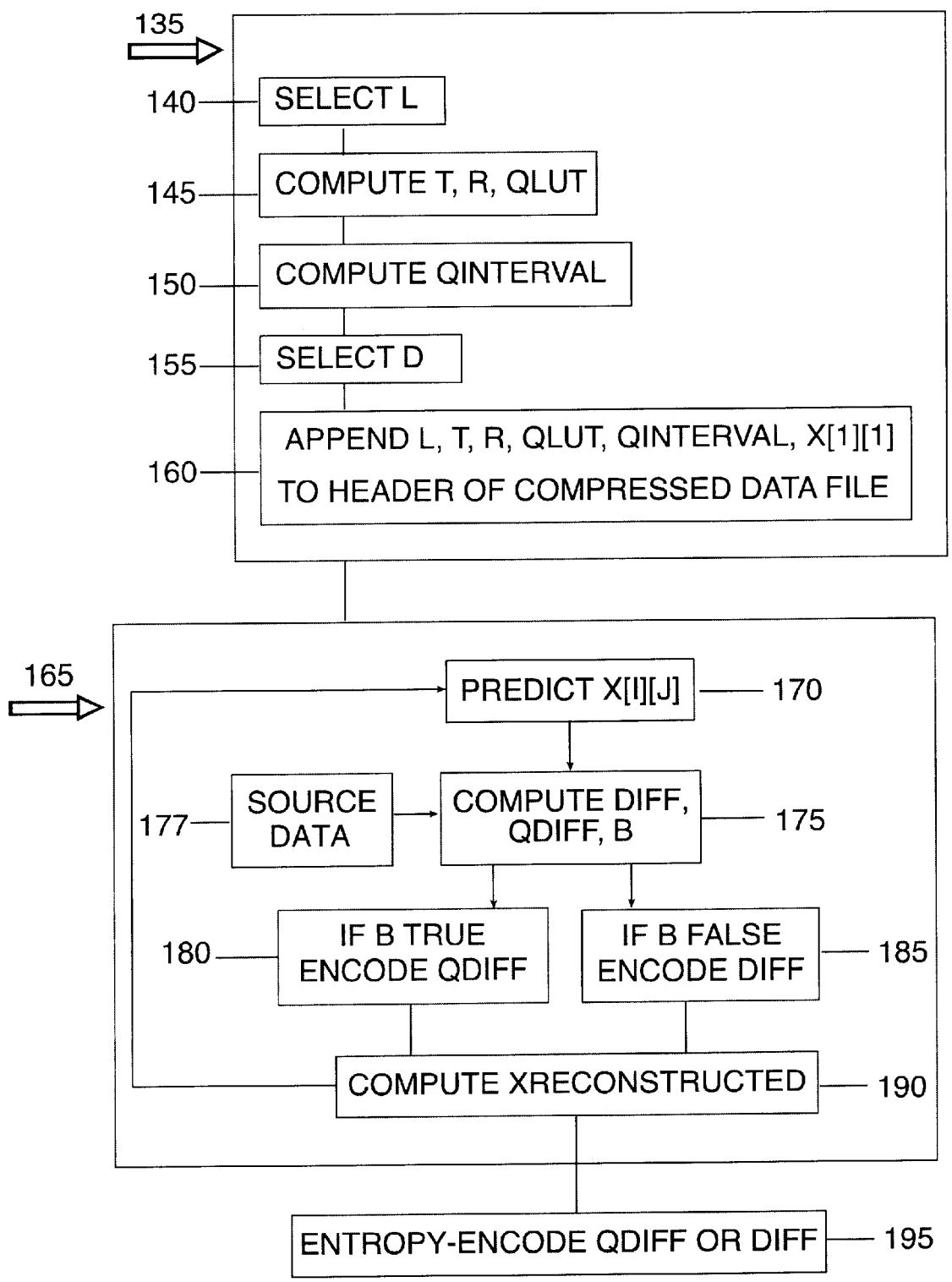
FIG. 5 is a schematic diagram of a DPCM encoder with non-uniform error quantization, according to the first preferred embodiment of the present invention.

FIG. 5 is a schematic diagram of the detailed method for compression contained in the first embodiment of this invention. The method is described for one channel of an image. Multiple channel images such as RGB images may be compressed by individual compression of each channel. Alternatively, it will be appreciated by persons skilled in the art that if there are interchannel correlations it may be advantageous to predict pixels in one channel from previously encoded pixels in another channel. Such a method is described in U.S. Pat. No. 5,680,129 (Weinberger, et al.). Other predictors may be used for predicting the Blue and Red planes to the one specified in Weinberger et al. ('129), such as, for example:

$x(i+1)=((a+b)/2)*(X(G)(i+1)/(a(G)+b(G)+1))$ where $a(G)+b(G)>0$

Figure 2A:
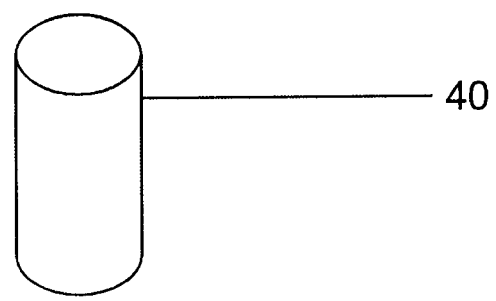
FIGS. 2A–2D are schematic diagrams of typical light-sensitive sensors.
Figure 2B:
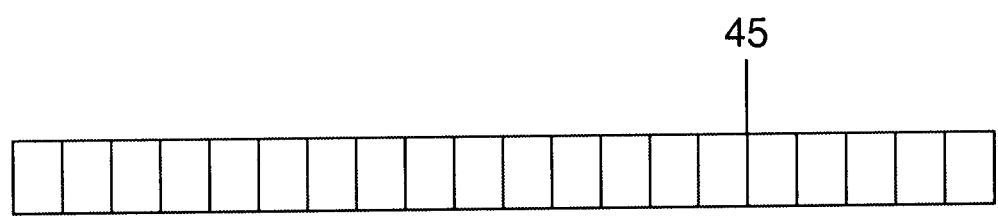
Figure 2C:
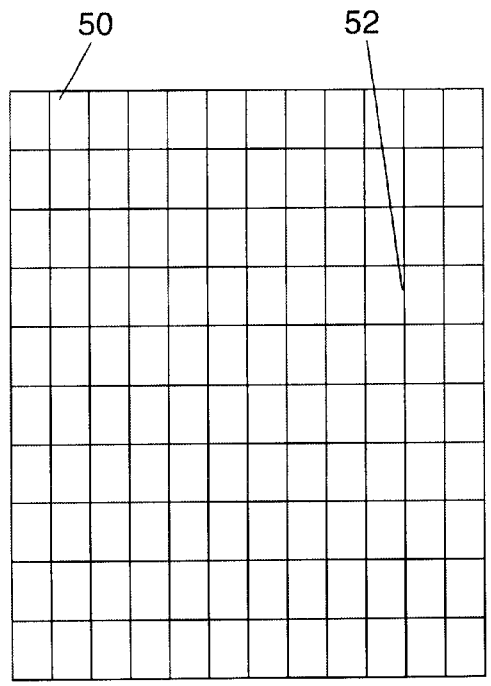
Figure 2D:
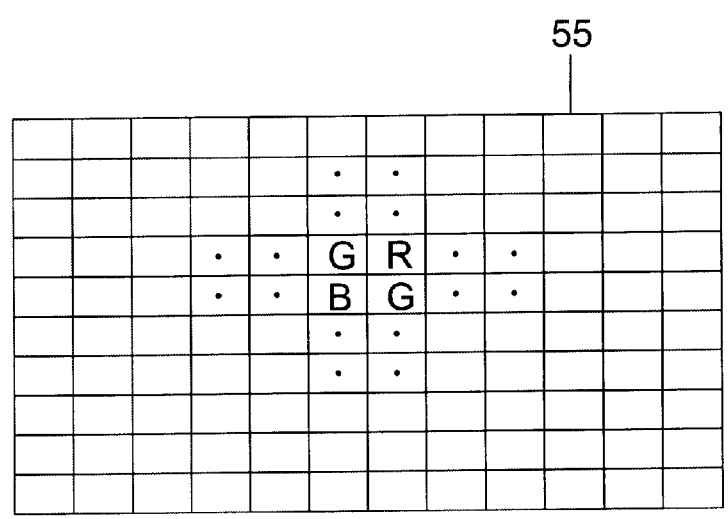

Colored mosaic images, such as image 55 described with reference to FIG. 2D, may also be compressed by the method described in this invention. The Red and Blue channels may be individually compressed since each forms a regular column- and row-aligned matrix. The Green channel may be compressed as two separate channels, the first comprising all G values falling on odd column locations and the second comprising all G values falling on even column locations. Both of these G channels form a regular column- and row-aligned matrix.

The following embodiments are hence conveniently described with reference to single channel compression but are not thus restricted.

In step 135 initialization is performed. This consists of the following steps:

In step 140, a level L of quantization is selected. A suitable L is such that the ratio $L/2^{\wedge}m$ is 1/10.

In step 145; the quantization tables T, R and QLUT are computed as described above, with reference to FIG. 3.

In step 150, a table of interval sizes QINTERVAL containing the interval size corresponding to each of the $2^{\wedge}m$ source values is computed as follows

QINTERVAL [0]=T[1]-T[0];

k=0;
for (j=0; j<2^m; j++)

```
{
    if (T[k]<=j)
    {
        k++;
        QINTERVAL[j]=T[k]-T[k-1];
    }
    else
        QINTERVAL[j]=T[k]-T[k-1];
}
```

In step 155, a difference threshold D is selected. A suitable D is $2^{\wedge}m/R[i]$, where i=1, 2, 3 or 4.

In step 160 the quantities L, T, R, QLUT, QINTERVAL and the value x[1][1] of the top-left pixel are appended to the header of the compressed data file.

In step 165, the prediction and error encoding loop is performed. This consists of the following steps:

In step 170 the current pixel x [i][j] is predicted by:

xPredicted [i][j]=xReconstructed [i][j−1]

For the first pixel x [1][1], xPredicted [1][1] is the original source pixel x [1][1]. For the first pixel on each subsequent line, xPredicted [j][1] is the last reconstructed pixel of the previous line, xReconstructed [j−1] [numCols] where num-Cols is the number of pixels in a column. For all other pixels the method for obtaining xReconstructed is described in step 190 below.

In step 175 the following quantities are computed using source data 177 and xPredicted [i][j] from step 170 above:

diff [i][j]=x [i][j]−xPredicted [i][j]

qdiff [i][j]=(int)(diff [i][j]/QINTERVAL [xPredicted [i][j]]+0.5)

rem=diff [i][j]% QINTERVAL [xPredicted [i][j]]

B=(abs(rem)<qINTERVAL [x[i][j]]||abs(qINTERVAL [x[i][j]]−rem)<qINTERVAL [x[i][j]])

The Boolean statement B is true if the value of x can be obtained with error less than interval size QINTERVAL [x] by adding an integral number of intervals of size QINTERVAL [xPredicted] to xPredicted.

If B is true, encode qdiff [i][j] as in step 180 below. Else encode diff [i][j] as in step 185 below.

In step 180, if the statement B is true and the value qdiff is less than D, the value qdiff is passed to the arithmetic entropy encoder 120.

In step 185, if the statement B is false, the value diff is encoded using an exception code method. The exception code is given by the value D followed by the exact value of diff, in 8 bit form if the number of bits m is 8 or less and in 16 bit form if number of bits is 16 or less, but greater than 8.

In step 190 the encoded error data is decoded to provide xReconstructed values for predicting the next pixel. If the value qdiff was less than D, then $$xReconstructed[i][j] =$$
$$xReconstructed[i-1][j] + qdiff[i][j] * QINTERVAL[xPredicted[i][j]]$$

Else xReconstructed [i][j]=xReconstructed [i−1][j]+diff [i][j]

In step 195 the encoded error data is entropy coded using an arithmetic coder such as that described in Numerical Recipes in C, section 20.5 (referenced above). The alphabet for the arithmetic encoder is {0, 1, . . . , D}. The encoded bit stream is however momentarily broken whenever the exception code D is encountered and the exact 8 or 16 bit value designated in step 185 is placed into the stream with no encoding.

It will be appreciated by persons skilled in the art that the parameters L and D may be selected to provide optimal compression for different classes of images and desired compression ratios. It will a so be appreciated that many steps in the described method may be improved to yield better compression ratios for the same distortion by use of additional computations or computer memory. For example, the predictions of initial pixels in each line may be made by the first pixel in the preceding line; the predictors may be functions of more pixels preceding the current pixel in this channel and in parallel channels; the exact differences diff[i][j] may also be encoded by an entropy encoding method as described in U.S. Pat. No. 6,680,129 (above), and so forth. It will also be appreciated that the step of entropy coding may be performed by a Huffman encoder, using an Initial first pass to derive the statistics required for the encoder or by another entropy encoder. Huffman encoders are described in Jain, "Fundamentals of Image Processing" (referenced above).

Figure 7:
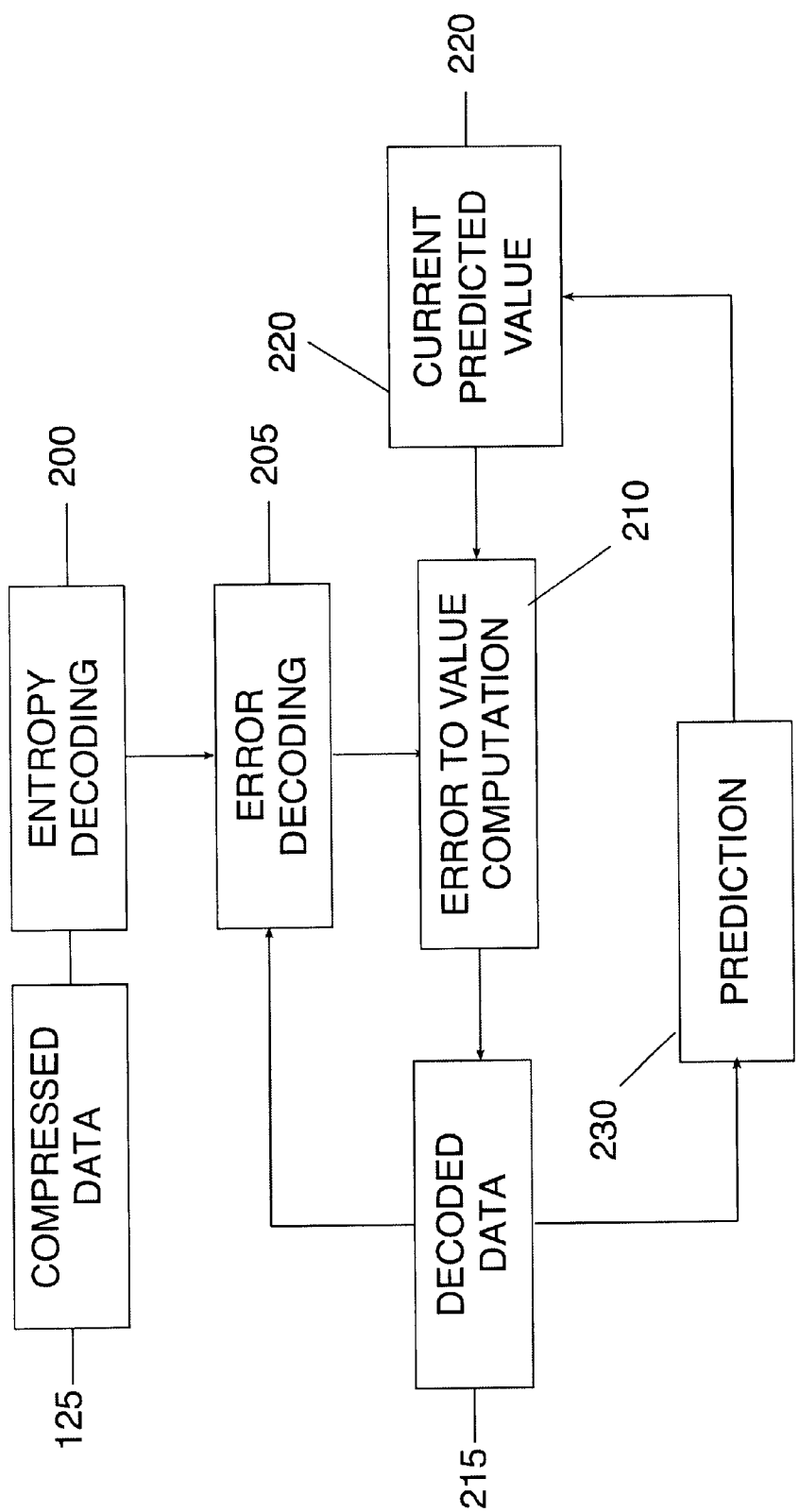
FIG. 7 is a schematic diagram of a DPCM decoder.

FIG. 7 is a schematic diagram of the central decoding loop of a generic DPCM decoder. In step 200 compressed data 125 is entropy decoded. In step 205 the entropy-decoded number is decoded to give an error value, using prior decoded signal data 215. In step 210, the current signal value is computed from the current predicted value 220 and the error value from step 205 and appended to decoded data 215. Decoded data 215 is used in step 230 to predict the next pixel value 220 according to the method of the encoder described with reference to FIG. 3.

To complete the description it is only necessary to state how the initial pixel is obtained in step 200. This can be done, for example, by reading the actual first pixel value from the beginning of the compressed data, placing it directly to predicted value 220 and decoded data 215 and continuing from the first encoded error.

Figure 8:
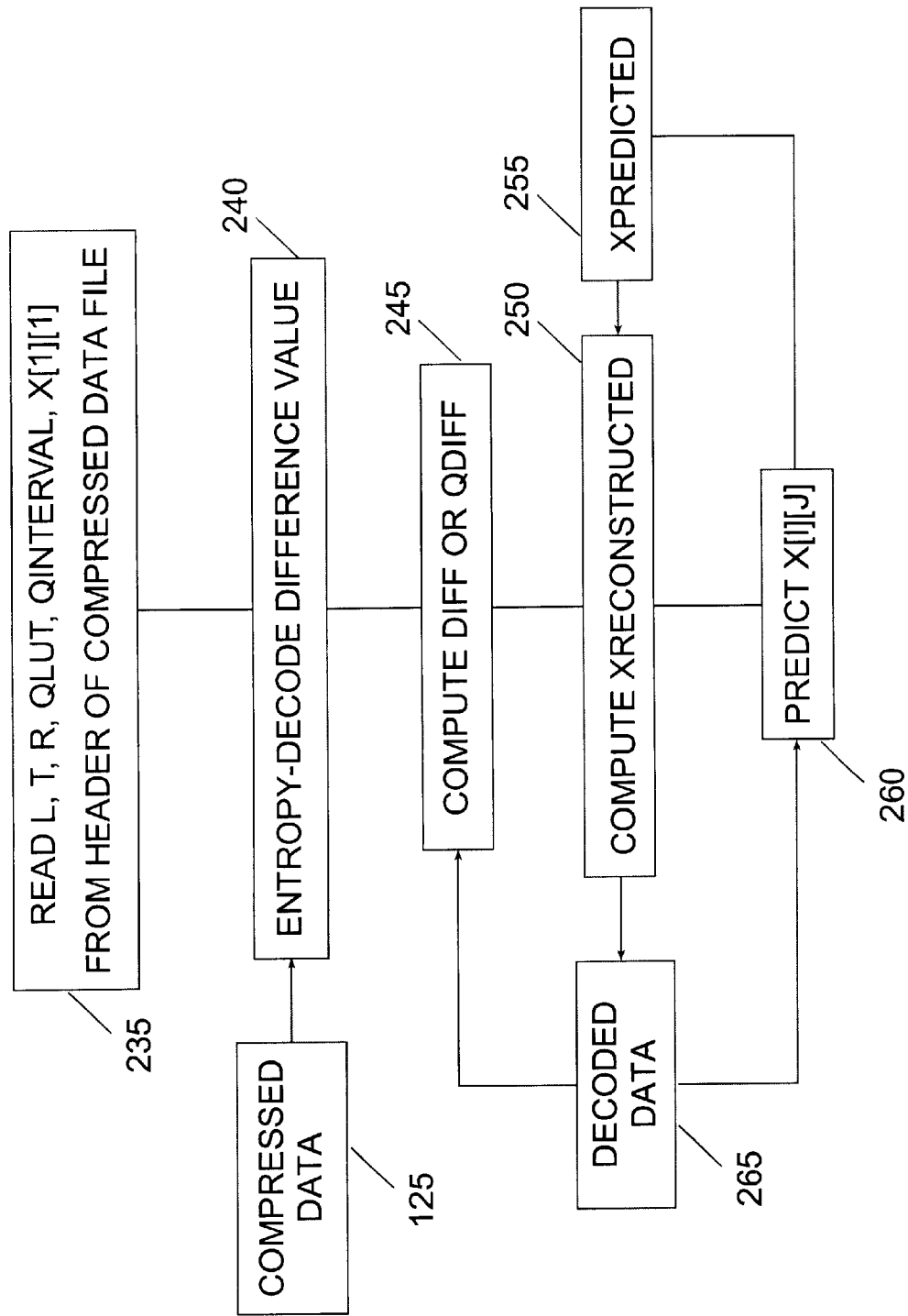
FIG. 8 is a schematic diagram of a DPCM decoder with non-uniform error quantization, according to the first preferred embodiment of the present invention.

FIG. 8 is a schematic diagram of the central decoding loop of a DPCM decoder with non-uniform error quantization, according to the first preferred embodiment of the present invention. In step 235 quantities L, T, R, QLUT, QINTERVAL and the value x [1][1] of the top-left pixel are read from the header of the compressed data file. In step 240 the next data item in the compressed data file is entropy-decoded using the arithmetic decoder corresponding to the arithmetic encoder used in step 195 above In step 245 the value diff or qdiff is computed. If exception code D is encountered the exact 8 or 16 bit value as designated in step 185 is taken as the value diff [i][j]. Else, the decoded value is placed in the variable qdiff [i][j] and the value diff [i][j] is computed as follows:

diff [i][j]=QINTERVAL [xPredicted [i][j]]*qdiff [i][j]

in step 250 the value xReconstructed is computed using predicted value 255 at follows:

xReconstructed [i][j]=xPredicted[i][j]+diff [i][j]

xReconstructed [i][j] is appended to decoded data 265. In step 260 decoded data 265 is used to predict the next pixel value 255 according to the method of the encoder described with reference to FIG. 5, for example:

xPredicted [i][j]=xReconstructed [i][j−1]

To complete the description it is only necessary to state how the initial pixel is obtained in step 240. This is done by placing x[1][1] read from the header directly into predicted value 255 and decoded data 265 and continuing from the first encoded error.

A second embodiment of a method for compressing noisy images is described with reference to the above mentioned Draft International Standard DIS14495-1 (JPEG-LS) (Addendum I, attached hereto) The steps to be performed are described in Annex A of the Draft International Standard DIS14495-1, with changes and additions mentioned as follows:

Introduce new symbols in section 3.3 of the International Draft Standard DIS14495-1 (Addendum I, attached hereto):

| | |
|---|---|
| m | the number of bits in a sample |
| L | the number of quantization levels (L<MAXVAL) |
| POWER | the measure of the noise as a power of the signal (POWER>1.0) |
| QINTERVAL | the size of the quantization interval containing a sample |
| T | the L+1 sample values corresponding to the L+1 limits of L quantization intervals in ascending order |
| R | the L sample values corresponding to the representative values of the quantization intervals in ascending order the MAXVAL+1 sample values quantized according to the L+1 limits of L quantization intervals in ascending order |

In the initialization step A2.1 (of the Draft International Standard DIS14495-1)(Note that similarly labeled steps hereinafter are also from this Draft International Standard DIS14495-1):

Delay step 1 until after additional steps 5, 6 and 7 as follows:

5. Compute a quantization interval table T as follows:

T [0]=0;

R [1]=(pow(0.5*((MAXVAL+1)/L),POWER)/pow((MAXVAL+1), POWER))*(MAXVAL);

for (k=2; k<=i, k++)

```
{
    R[k]= (pow ((k-0.5)*( (MAXVAL+1)/L),POWER)/
        pow((MAXVAL+1),POWER) )*(MAXVAL);
    T[k-1]= (short)((float)(R[k-1]+R[k])/2.0)
}
```

T [L]=MAXVAL;

6. Compute a quantized value lookup table as follows:

[0]=0;
for (i=1; i<2^m; i++)

```
            {
            [i]=0;
            for (j=0;j<=L;j++)
                {
                if (T[j]>i)
                    {
                    [i]=R[j];
                    break;
                    }
                }
            }
```

7. Compute a table of interval sizes QINTERVAL containing the interval size corresponding to each of the 2^m source values as follows:

QINTERVAL [0]=T[1]–T[0];

k=0;
for (j=0; j<2^m; j++)

```
    {
    if (T[k]<=j)
        {
        k++;
        QINTERVAL[j]=T[k]–T[k-1];
        }
    else
        QINTERVAL[j]=T[k]–T[k-1];
    }
```

Now perform step 1 as follows:

1. Compute the parameters, NEAR and RANGE:

NEAR=QINTERVAL[0]/2;

RANGE=(int)((MAXVAL+2*NEAR)/(2*NEAR+1))+1;

Compute the parameters qbpp=(int)(log[RANGE]+1), bpp=max(2,(int)(log(MAXVAL+1)+1), and LIMIT=2*(bpp+max(8,bpp)).

In local gradient computation step A.3.1:

D1=Rd–Rb;

D2=Rb–Rc;

D3=Rc–Ra;

Also compute:

D1_UNIT=QINTERVAL [min(Rd,Rb)]/2;

D2_UNIT=QINTERVAL [min(Rb,Rc)]/2;

D3_UNIT=QINTERVAL [min(Rc,Ra)]/2;

In mode selection step A.3.2, let Figure A.2 read:

```
if (  (abs(D1) <= D1_UNIT) && (abs(D2) <= D2_UNIT) && (abs(D3) <=
      D3_UNIT) )
    goto RunModeProcessing;
else
    goto RegularModeProcessing;
```

In local gradient quantization step A.3.3, let Figure A.4 read:
   if (Di<=-T3*Di_UNIT) Qi=-4;
   else if (Di<=-T2*Di_UNIT) Qi=-3;
   else if (Di<=-T1*Di_UNIT) Qi=-2;
   else if (Di<-Di_UNIT) Qi=-1;
   else if (Di<=Di_UNIT) Qi=0;
   else if (Di<T1*Di_UNIT) Qi=1;
   else if (Di<T2*Di_UNIT) Qi=2;
   else if (Di<T3*Di_UNIT) Qi=3;
   else Qi=4.
In prediction correction step A.4.2, let Figure A.6 read:
   if (SIGN==+1)
      Px=Px+C[Q}*QINTERVAL[Px];
   else
      Px=Px-C[Q}*QINTERVAL[Px];
   if (Px>MAXVAL)
      Px=MAXVAL;
   else if (Px<0)
      Px=0;
In error quantization step A.4.4, the quantization is based on the non-uniform quantization computed in the initialization step above and not on the uniform quantization used in the Draft International Standard DIS14495-1 (JPEG-LS) referenced above. Let Figure A.8 read:
   REM=Errval % QINTERVAL [Px];
   B=(abs(REM)<QINTERVAL [Ix]/2||
      abs (QINTERVAL [Px]-REM)<QINTERVAL [Ix]/2)
   if (~B)

```
   {
      qErrval= (int) (Errval/QINTERVAL[0] + 0.5);
      Errval=qErrval;
      Rx= Px + SIGN*Errval*QINTERVAL[0];
      goto ExceptionModeProcessing
   }
   else
   {
      qErrval=(int) (Errval/QINTERVAL[Px] + 0.5);
      Errval=qErrval;
      Rx= Px+SIGN*Errval*QINTERVAL[Px];
      if (Rx>MAXVAL)
         Rx=MAXVAL;
      else if (Rx<0)
         Rx=0;
   }
```

The Boolean statement B is true if the value of x can be obtained with error less than interval size QINTERVAL [Ix], by adding an integral number of intervals of size QINTERVAL [PX] to Px. If B is true RegularModeProcessing continues else ExceptionModeProcessing is invoked. ExceptionModeProcessing is described below with reference to section A.5.4 to be added to the standard as described below.

In error mapping step A.5.2, since this is inherently a nearly lossless procedure, let Fig. A.11 read:
   if (Errval>=0)
      MErrval=2*Errval+1;
   else
      MErrval=-2*Errval-1;
   Add section A.5.4 as follows:
   A.5.4 ExceptionModeProcessing
      If the Errval computed in A4.4 is larger than the quantization interval associated with the actual value Ix, the residual Errval is coded where Errval is the integral number of minimal-sized intervals between Px and Ix. The encoding is performed as follows:
   a. Compute the value Merrval as described in the corrected figure A.11 in step A.5.2 above.
   b. Compute a second "escape code" different to the escape code used for the limited length Golomb code LG(k, limit) where limit is LIMIT-qbpp-1 as described in section A.5.3 of the above standard. The second escape code is LIMIT-qbpp encoded in unary representation, i.e., LIMIT-qbpp zeros followed by a one.
   c. Append the escape code followed by the value MErrval-1 in binary representation to the encoded bit stream. RegularModeProcessing is then resumed for the next pixel location, without performing update variables step A.6.

In update step A.6.1 let the first line in Figure A.12 be replaced by the following:
   if (~B)
      B[Q]=B[Q]]+Errval*QINTERVAL[0];
   else
      B[Q]=B[Q]+Errval*QINTERVAL[Px];
In run scanning step A.7.1, let Fig. A.14 read:
RUNval=Ra;
RUNcnt=0;
while (abs(Ix-RUNval)<=QINTERVAL[Ix]/2)

```
{
   RUNcnt = RUNcnt + 1;
   Rx = RUNval;
   if (EOLine == 1)
      break;
   else
      GetNextSample();
}
```
In run interruption sample encoding step A.7.2, let FIG. A.17 read:
if (abs (Ra-Rb) <= QINTERVAL [min(Ra,Rb)]/2)
   RIType = 1;
else if (Rx < 0)
   RIType = 0;
Let FIG. A.19 read:
if (RIType ==0 && (Ra > Rb))
{
   Errval = -Errval;
   SIGN = -1;
} else
   SIGN=1;
Errval=Quantize(Errval);
Rx=ComputeRx(Errval);
Errval=ModRange(Errval, RANGE);
where Quantize(), ComputeRx() and ModRange() are the revised functions described above.

If ExceptionModeProcessing was invoked in performing Quantize(Errval), the steps following Quantize(Errval) will be skipped, including steps 4–9 of section A.7.2. RegularModeProcessing will thus be resumed at the next pixel location. If ExceptionModeProcessing was not invoke in performing Quantize(Errval), steps 4–9 of section A.7.2 are completed as specified.

An alternate embodiment of a method for decompressing noisy images is as follows. Initially, with reference is made to the above mentioned Draft International Standard DIS14495-1 (JPEG-LS) (Addendum I, referenced above).

In this method all steps are performed as described in Annex F of the above mentioned standard with the changes and additions described below. Where reference is made in Annex F to Annex A, use the revised Annex A, as described above for the second embodiment of the present invention. The method is as follows:
Delay step 1.c until after step g.
Add steps g and h as follows:
g. Compute T. R. QINTERVAL, as specified in A.2.1
h. Now compute range as specified in A.2.1.
Add step 9.c as follows:
c. If the unary code contains LIMIT-qbpp zeros, read an additional qbpp bits to get a binary representation of Merrval.
Correct step 12 to read as follows:
12. If the last unary code read was the code for ExceptionModeProcessing, multiply Errval by QINTERVAL[0]. Else multiply Errval by QINTERVAL[Px].
Correct step 14 to read as follows:
14. Compute Rx=Errval+[Px] modulo M where M=RANGE*QINTERVAL[0] or M=RANGE*QINTERVAL[Px], depending on the alternative computed in step 12. Clamp Rx to [0 ... MAXVAL]. This is done as follows:
   if (Rx<-M)
     Rx=Rx+RANGE*M;
   else
     if (Rx>MAXVAL+M/2) Rx=Rx-RANGE*M;
   if (Rx<0)
     Rx=0;
   else if (Rx>MAXVAL)
     Rx=MAXVAL;
   if (Rx<0)
     Rx=0;
   else if (Rx>MAXVAL)
     Rx=MAXVAL;

It will be readily apparent to persons skilled in the art that two cycles of compression and decompression using the above embodiments will result in the second decompressed data being identical to the first decompressed data. This allows multiple compression and decompression cycles without image degradation.

Figure 6:
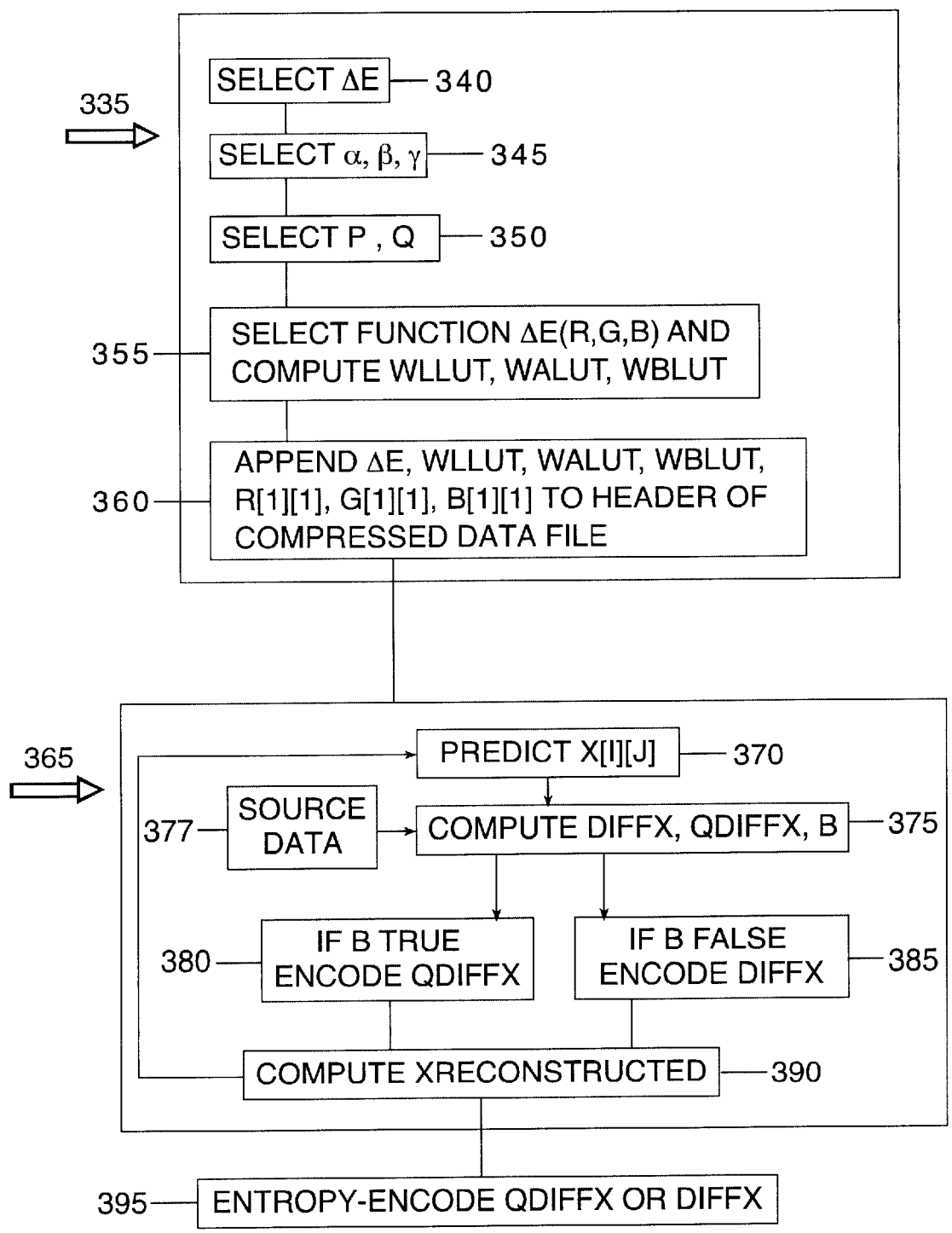
FIG. 6 is a schematic diagram of a DPCM encoder with non-uniform error quantization, according to the third preferred embodiment of the present invention.

It will be appreciated by persons skilled in the art that the quantization of residual differences according to the two above preferred embodiments will result in more than L actual values in the decompressed file, in distinction to the method of direct quantization of values followed by lossless compression described above with reference to FIG. 3. However, the compression and decompression cycle may still result in some posterized areas by these or other embodiments. This posterization may be partially alleviated by including a post processing step wherein a random value is added to each decompressed signal value simulating the original known signal dependent noise in distribution but smaller in amplitude so as not to affect the visual fidelity of the signal. The computation of random noise resembling Poisson noise is effected with the help of a random gaussian deviate generator. Gaussian deviate generators are described in section 7.2 of "Numerical Recipes in C" (referenced above)(attached hereto in Addendum II). Gaussian deviates may be used instead of Poisson deviates because the Gaussian probability distribution approximate the Poisson probablity distribution except for signal of very small magnitude. To add noise to the decompressed signal proceed as follows:

Select a factor f less than 1. A useful factor is f=0.5. For each decompressed signal value, s, compute a new value s':

$$s' s+f*sqrt(s)*nd$$

where nd is a random normal deviate, newly generated for each value s,

FIG. 6 is a schematic diagram of the detailed method for compression contained in a third embodiment of this invention. Appendix D, attached hereto, provides a description of the mathematical basis for this embodiment, as described below.

The method is described for an RGB image. The compression may be performed for other multi-component color images such as CMYK images, provided a mapping is provided for evaluating the CIELab value for each multi-component source datum. The compression may also be performed for other psychovisual spaces such as CIELuv or CIEXYZ which are mathematical transformations of CIELab space. The following embodiments are hence conveniently described with reference to RGB data compression and CIELab space but are not thus restricted.

As mentioned above, it will be appreciated by persons skilled in the art that if there are inter-component correlations it may be advantageous to predict pixels in one component from previously encoded pixels in another component, rather than from the immediately preceding pixel in the same component, as in the generic method described above.

The following embodiments are hence conveniently described with reference to a specific predictor but are not thus restricted.

It will be appreciated by persons skilled in the art that there are many conceivable measures of distance in CIELab space that have psychovisual significance. The most common measure is $\Delta E = \text{sqrt}(\Delta L*\Delta L+\Delta a \Delta a+\Delta b*\Delta b)$. Another measure is CIE94, described in Fairchild, "Color Appearance Models" (above). The following embodiments are hence conveniently described with reference to a specific distance measure but are not thus restricted.

In addition, parts of the following embodiments are conveniently described with reference to signal values of 8 bits but are not thus restricted. These parts of the following embodiments may be easily adapted by obvious changes to signals of depth greater than 8 bits.

It is an inherent feature of the invention that the multi-component data come accompanied by a mapping P to a psycho-visual space such as CIELab, i.e.

$$P: R \times G \times B \rightarrow L \times a \times b.$$

P is assumed to be a data structure such as a 3D lookup table or an ICC input profile, as described in Spec ICC.1, referenced above, together with a method for evaluating any given input. Thus for every value (R,G,B), the mapping specifies a corresponding (L,a,b) value. We denote LP(R,G,B), aP(R,G,B), bP(R,G,B) to be the L, a, b value mappings respectively. We denote r[i][j], g[i][j], bl [i][j] to be the component values at pixel location (i,j).

In step 335 initialization is performed. This consists of the following steps:

In step 340, a base level $\Delta E$ of quantization error is selected. A suitable max$\Delta E$ is 4.

In step 345, weights for the relative significance of L, a and b errors are selected—$\alpha$, $\beta$ and $\gamma$ respectively. Suitable values are $\alpha=2$, $\beta=1$, $\gamma=1$. These are comparable to the JPEG method of subsampling the color components but here small amplitude differences rather than high frequency information are discarded.

In step 350, weights for the relative loading of error into source components R,G and B are selected: p is the relative loading of R with respect to G and q is the relative loading of R with respect to B. Suitable values are p=1, q=½.

In step 355, a distance function for $\Delta E$ is selected. A suitable distance function is given by:

$$\Delta E = \text{sqrt}(\alpha * WL(L, a, b) * \Delta L * \Delta L + \beta * Wa(L, a, b) * \Delta a * \Delta a + \gamma * Wb(L, a, b) * \Delta b * \Delta b)$$

where $WL(L, a, b) = Wa(L, a, b) = Wb(L, a, b) = 2 - \text{sqrt}((a/\mathbf{128}) * (a/\mathbf{128}) + (b/\mathbf{128}) * (b/\mathbf{128}))/1.4$ The weighting functions WL, Wa, and Wb in (L, a, b) amplifies the distance measure near neutral colors. This will allow more quantization in saturated colors than in near neutral colors.

Three 33*33*3 gradient tables DR, DG, DB are created as follows:

for (i=0; i<33; i++)

```
{
l = i * 8;
for (j = 0 ; j < 33 ; j++)
{
    a = k* 8;
    for (k = 0 ; k < 33 ; k++)
    {
        b = k*8;
        wN = 2-sqrt((aP(r,g,bl)/128)*( aP(r,g,bl)/128) +
             (bP(r,g,bl)/128)*(bP(r,g,bl)/128))/1.4;
        DR [i][j][k] = sqrt(
             α * wN *
             (LP(r + 8,g,bl) − LP(r,g,bl) 8) *
             (LP(r + 8,g,bl) − LP(r,g,bl)) +
             β * wN *
             (aP(r + 6,g,bl) − aP(r,g,bl)) *
             (aP(r + 8,g,bl) − aP(r,g,bl)) +
             γ * wN *
             (bP(r + 8,g,bl) − bP(r,g,bl)) *
             (bP(r + 8,g,bl) − bP(r,g,bl)))/8;
        DG [i][j][k] = sqrt(
             α * wN *
             (LP(r,g + 8,b#) LP(r,g,bl)) *
             (LP(r,g + 8,bl) − LP(r,g,bl)) +
             β * wN *
             (aP(r,g + 8,bl) − aP(r,g,bl)) *
             (aP(r,g + 8,bl) − aP(r,g,bl)) +
             γ * WN *
             (bP(r,g + 8,bl) − bP(r,g,bl)) *
             (bP(r,g + 8,bl) − bP(r,g,bl)))/8;
        DB [i][j][k] = sqrt(
             α * wN *
             (LP(r,g,bl + 8) − LP(r,g,bl)) *
             (LP(r,g,bl + 8) − LP(r,g,bl)) +
             β * wN *
             (aP(r,g,bl + 8) − aP(r,g,bl)) *
             (aP(r,g,bl + 8) − aP(r,g,bl)) +
             γ * wN *
             (bP(r,g,bl + 8) − bP(r,g,bl)) *
             (bP(r,g,bl + 8) − bP(r,g,bl)))/8;
    }
}
```

In step 360 the quantities maxΔE, DR, DG, DB, r [1][1], g [1][1] and bl[1][1] are appended to the header of the compressed data file.

In step 365, the prediction and error encoding loop is performed. This consists of the following steps:

In step 370 the current pixel (r [i][j], g [i][j], bl [i][j]) is predicted by:

xPredicted [i][j]=xReconstructed [i][j−1]

where x is r, g and b successively. Subsequent references to pixel x imply the action is to be performed for r, g and b unless otherwise stated.

For the first pixel x [1][1], xPredicted [1][1] is the original source pixel x [1][1]. For the first pixel on each subsequent line, xPredicted [j][1] is the last reconstructed pixel of the previous line—xReconstructed [j−1][numCols]—where numCols is the number of pixels in a column. For all other pixels the method for obtaining xReconstructed is described in step 390 below.

In step 375 the following maximum allowable contributions are computed using source data 377, tabls. DR, DG, DB from step 355 above and xPredicted [i][j] from step 370 above:

maxΔR (r [i][j], g [i][j], bl [i][j])=maxΔE/(DR(r [i][j], g [i][j], bl [i][j])+(1/p)*DG(r [i][j], g [i][j], bl [i][j])+(1/q)*DB(r [i][j], g [i][j], bl [i][j]));

maxΔG (r [i][j], g [i][j], bl [i][j])=maxΔE/(p*DR(r [i][j], g [i][j], bl [i][j])+DG(r [i][j], g [i][j], bl [i][j])+(p/q)*DB(r [i][j], g [i][j], bl [i][j]));

maxΔBL (r [i][j], g [i][j], bl [i][j])=maxΔE/ (q*DR(r [i][j], g [i][j], bl [i][j])+(q/p)*DG(r [i][j], g [i][j], bl [i][j])+DB(r [i][j], g [i][j], bl [i][j]));

Also compute:

maxΔRPredicted (rPredicted [i][j], gPredicted [i][j], blPredicted [i][j])

maxΔGPredicted (rPredicted [i][j], gPredicted [i][j], blPredicted [i][j]), and maxΔBLPredicted (rPredicted [i][j], gPredicted [i][j], blPredicted [i][j])

using the; formulas described above for maxΔR, maxΔG and maxΔBL in which xPredicted is substituted for x.

For x=r, g, bl:

diffx [i][j]=x [i][j]−xPredicted [i][j];

$$qdiff[i][j] = (int)(diffx[i][j] / \max\Delta X predicted$$

$$(rPredicted[i][j], gPredicted[i][j], blPredicted[i][j]) +$$

$$0.5);$$

remx=diffx [i][j]% maxΔxPredicted (rPredicted [i][j], gPredicted [i][j], blPredicted [i][j]);

Sx=(abs(remx)<maxΔX (r [i][j], g [i][j], bl [i][j])||abs(ΔX(r [i][j], g [i][j], bl [i][j])−remx)<maxΔX (r [i][j], g [i][j], bl [i][j]));

The Boolean statement Sx is true if the value of x can be obtained with error less than interval size maxΔX (r [i][j], g [i][j], bl [i][j]) by adding an integral number of intervals of size maxΔxPredicted (rPredicted [i][j], gPredicted [i][j], blPredicted [i][j]) to xPredicted.

If B is true, encode qdiffx [i][j] as in step 380 below. Else encode diffx [i][j] as in step 385 below.

In step 380, if the statement B is true and the value qdiffx is less than D, the value qdiffx is passed to the arithmetic entropy encoder 120.

In step 385, if the statement B is false, the value diff is encoded using an exception code method. The exception code is given by the value D followed by the exact value of diffx, in 8 bit form if the number of bits m is 8 or less and in 16 bit form if number of bits is 16 or less, but greater than 8.

In step 390 the encoded error data is decoded to provide xReconstructed values for predicting the next pixel. If the value qdiffX was less than D, then $$xReconstructed[i][j] = xReconstructed[i-1][j] + qdiffx[i][j] *$$
$$\Delta X predicted(rPredicted[i][j],$$
$$gPredicted[i][j], blPredicted[i][j]);$$

else xReconstructed [i][j]=xReconstructed [i-1][j]+diffX [i][j]

In step 395 the encoded error data is entropy coded using an arithmetic coder such as that described in Section 20.5 of "Numerical Recipes in C" (referenced above). The alphabet for the arithrfetic encoder is {0, 1, . . . , D}. The encoded bit stream is however momentarily broken whenever the exception code D is encountered and the exact 8 or 16 bit value designated in step 385 is placed into the stream with no encoding.

It will be appreciated by persons skilled in the art that the table structures DR, DG and DB may be computed to any desired accuracy, up to the accuracy contained in the mapping P from the original space to CIELAB space, by increasing the resolution of the lattice of (r,g,bl) values in the initialization step 335. The quantities maxΔR(r,g,bl), maxΔG(r,g,b) and maxΔBL(r,g,bl) may also be precalculated into a 3D table to increase efficiency and their values may subsequently be found by looking up the nearest neighbor entry in the 3D table or, if a more accurate approximation is desired, interpolation may be performed between several nearest neighbors in the 3D table. Such an embodiment is described below with reference to FIG. 9.

For better approximation the lattice in r,g,bl should be such that we get a uniform sampling in CIELab space, namely in the output space of the mapping from RGB to CIELab. In this regard there are two common possibilities: (1) the RGB data represent actual light intensities as, for example, data from linearly responsive sensors, or (2) they represent logarithmic or similar non-uniform transformations of light intensities, as, for example, after monitor gamma transformation. In the first case, better sampling in the CIELab space is at least partially achieved by selecting the r, g and b sampling points to be uniformly spaced in their cubed values since CIELab components take the cube roots of raw values. A method for doing this is specified in the initialization step (A2.1) of a second preferred embodiment below. In case (2) above, a uniform RGB sampling lattice is satisfactory.

It will be appreciated by persons skilled in the art that the parameters α, WL(L, a, b), β, Wa(L, a, b), γ, Wb(L, a, b), ΔE and D may be selected to provide optimal compression for different classes of images and desired compression ratios. In addition, any smooth, positive function in L,a,b may be employed as a distance function.

It will also be appreciated that many steps in the described method may be improved to yield beer compression ratios for the same distortion by use of additional computations or computer memory. For example, the predictions of initial pixels in each line may be made by the first pixel in the preceding line; the predictors may be functions of more pixels preceding the current pixel in the current component and in already encoded parallel components; the exact differences diffx [i][j] may also be encoded by an entropy encoding method such as described in U.S. Pat. No. 5,680, 129, referenced above, and so forth. It will also be appreciated that the step of entropy coding may be performed by a Huffman encoder, using an initial first pass to derive the statistics required for the encoder or by another entropy encoder. Huffman encoders are described in Jain, "Fundamentals of Image Processing" (referenced above).

Figure 9:
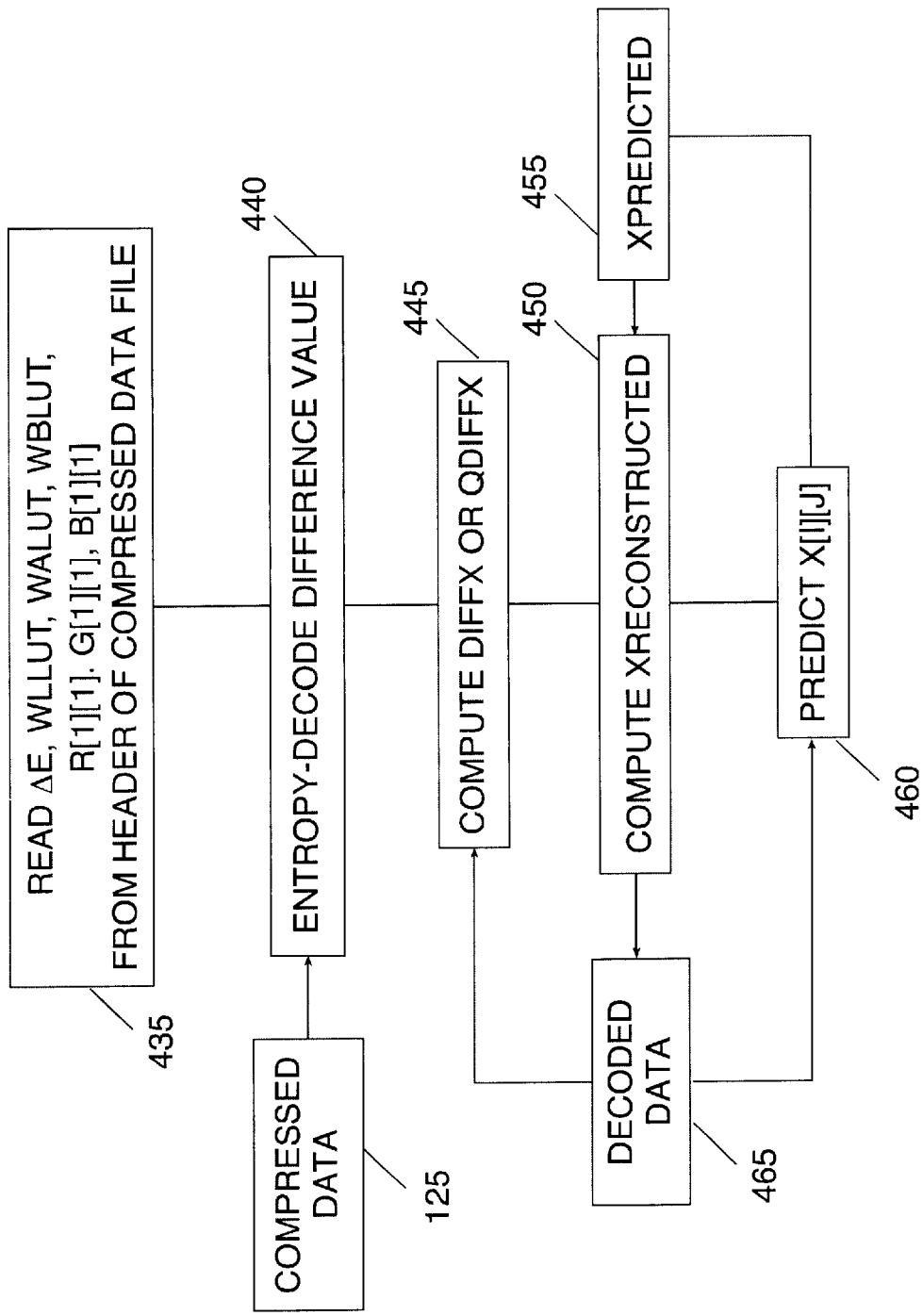
FIG. 9 is a schematic diagram of a DPCM decoder with non-uniform error quantization, according to the third preferred embodiment of the present invention.

FIG. 9 is a schematic diagram of the central decoding loop of DPCM decoder with non-uniform error quantization, according to the third embodiment of the present invention. In step 435 quantities ΔE, DR, DG, DBL, r [1][1], g [1][1] and bl [1][1] are read from the header of the compressed data file. In step 440 the next data item in the compressed data file is entropy-decoded using the arithmetic decoder corresponding to the arithmetic encoder used in step 395 above. In step 445 the values diffx or qdiffx for r,g and bl are computed. The following steps are then performed for x=r,g and bl.

If exception code D is encountered the exact 8 or 16 bit value as designated in step 385 is taken as the value diffx [i][j]. Else the decoded value is placed in the variable qdiff [i][j] and the value diffx [i][j] is computed as follows:

$$diffx[i][j] = max\Delta xPredicted(rPredicted[i][j],$$
$$gPredicted[i][j], blPredicted[i][j]) * qdiffx[i][j];$$

where maxΔRpredicted, maxΔgPredicted and maxΔBLPredicted are computed as in step 375 described above with reference to FIG. 6.

In step 450 the value xReconstructed is computed using predicted value 455 as follows:

xReconstructed [i][j]=xPredicted[i][j]+diffx [i][j]

xReconstructed [i][j] is appended to decoded data 465. In step 460 decoded data 465 is used to predict the next pixel value 455 according to the method of the encoder described with reference to FIG. 6, that is:

xPredicted [i][j]=xReconstructed [i][j-1]

To complete the description it is only necessary to state how the initial pixel is obtained in step 440. This is done by placing x[1][1] read from the header directly into predicted value 455 and decoded data 465 and continuing from the first encoded error.

A fourth embodiment of a method for compressing noisy images is described with reference to the above mentioned Draft International Standard DIS14495-1 (JPEG-LS). The embodiment requires use of sample interleaved mode, as described in Annex B.3 of the standard. It is assumed that the RGB data are directly proportional to light intensities and consequently use uniform sampling in cubic space. Perform all the steps described in Annex A of the above mentioned standard with the following changes and additions:

Introduce new symbols in section 3.3 of the Draft International Standard DIS14495-1 (above):

| | |
|---|---|
| m | the number of bits in a sample |
| maxΔE | the maximum error in CIELab space multiplied by 2 |
| MAXΔ | a 3 output, 3 input mapping containing measures of the contribution of each color component at a given color to the error distance in CIELab space according to some CIELab distance measure |
| LUTRES | (the number of quantization intervals for quantizing MAXVAL according to the cube of the value) + 1; default = 65 |

| | |
|---|---|
| LINCUBTBL | a 1D lookup table for finding the nearest interval limit for a raw value in the cubed quantization of MAXVAL |
| α, β, γ | weighting coefficients for color parameters L,a,b |
| WL(L,a,b), Wa(L,a,b), Wb(L,a,b) | weighting functions for color differences from color (L,a,b) in the direction of L, a and b respectively |
| DR(R,G,B), DG(R,G,B), DB(R,G,B) | weighting functions for color differences from color (L,a,b) in the direction of L, a and b respectively |

In the process flow description B.3.2, change 4 to read:
4. Follow steps 4 to 15 in the procedure described in A.8 for each one of the current samples of each component. Each of steps 4–15 for the sample j of the component i shall be completed before the same step for the sample j of the next component i+1 are performed. Steps 4–15 of sample j+1 of any component are not performed until these steps are completed for all the samples j for all the components. The same set of variables is used in these steps, but the context determination and the prediction are performed for each component separately. The encoding of the sample j in component i+1 uses the variables already updated by the sample j in the previous component i.

In the initialization step (A2.1), let step 1 read as follows:
1. Compute table LINGUBTBL:
   const=MAXVAL/pow ((LUTRES−1),3);
   const1=sqrt(1.0/const);
   width=MAXVAL/(LUTRES−1);
   for (x=0; x<MAXVAL; x++)

```
{
    if (x< = const1)
        LINCUBTBL [x] = x;
    else
    {
        temp1 = const * ((int)pow(x/WIDTH),3)
        temp2 = const * ((int)pow(x/WIDTH) + 1),3));
        temp3 = const * pow(x,3);
        if abs(temp3 − temp1) < abs (temp3 − temp2)
            LINCUBTBL [x] = (int)(x/WIDTH);
        else
            LINCUBTBL [x] = (int)(x/WIDTH + 1)
    }
}
```

Using parameters α, β, γ, WL(L, a, b), Wa(L, a, b), Wb(L, a, b), construct 3D lookup table MAXΔ as follows:
   for (i=0; i<LUTRES; i++)

```
{
    r = LINCUB(i);
    for (j = 0; j < LUTRES; j++)
    {
        g = LINCUB(j);
        for (k = 0; k < LUTRES; k++)
        {
            bl = LINCUB(k);
            wN = 2-sqrt((ap(r,g,bl)/128)*( aP(r,g,bl)/128) +
                 (bP(r,g,bl)/128)*(bP(r,g,bl)/128))/1.4;
            DR [i][j][k] = sqrt(
                α * wN *
                (LP(r + 8,g,bl) − LP(r,g,bl) 8) *
                (LP(r + 8,g,bl) − LP(r,g,bl)) +
                β * wN *
                (aP(r + 8,g,bl) − aP(r,g,bl)) *
                (aP(r + 8,g,bl) − aP(r,g,bl)) +
                γ * wN *
                (bP(r + 8,g,bl) − bP(r,g,bl)) *
                (bP(r + 8,g,bl) − bP(r,g,bl)))/8;
            DG [i][j][k] = sqrt(
                α * wN *
                (LP(r,g + 8,bl) − LP(r,g,bl)) *
                (LP(r,g + 8,bl) − LP(r,g,bl)) +
                β * wN *
                (aP(r,g + 8,bl) − aP(r,g,bl)) +
                (aP(r,g + 8,bl) − aP(r,g,bl)) +
                γ * wN *
                (bP(r,g + 8,bl) − bP(r,g,bl)) *
                (bP(r,g + 8,bl) − bP(r,g,bl)))/8;
            DB [i][j][k] = sqrt(
                α * wN *
                (LP(r,g,bl + 8) − LP(r,g,bl)) *
                (LP(r,g,bl + 8) − LP(r,g,bl)) +
                β * wN *
                (aP(r,g,bl + 8) − aP(r,g,bl)) *
                (aP(r,g,bl + 8) − aP(r,g,bl)) +
                γ * wN *
                (bP(r,g,bl + 8) − bP(r,g,bl)) *
                (bP(r,g,bl + 8) − bP(r,g,bl)))/8;
            maxΔR (r [i][j], g [i][j], bl [i][j]) = maxΔD/
                (DR (r [i][j], g [i][j], bl [i][j]) +
                (1/p) * DG (r [i][j], g [i][j], bl [i][j]) +
                (1/q) DB (r [i][j], g [i][j], bl [i][j]));
            maxΔG (r [i][j], g [i][j], bl [i][j]) = maxΔE/
                (p * DR (r [i][j], g [i][j], bl [i][j]) +
                DG (r [i][j], g [i][j], bl [i][j]) +
                (p/q) * DB (r [i][j], g [i][j], bl [i][j]));
            maxΔBL (r [i][j], g [i][j], bl [i][j]) = maxΔE/
                (q * DG (r [i][j], g [i][j], bl [i][j]) +
                (q/p) * DG (r [i][j], g [i][j], bl [i][j]) +
                DB (r [i][j], g [i][j], bl [i][j]));
        }
    }
}
``` where function LINCUB(x) is:

```
{
    if (x <= const1)
        x = i;
    else
        x = const * pow(i,3):
}
```

Select NEAR. A suitable value is:

$$NEAR = \min\{\Delta X / 2; \Delta X = MAX\Delta R(r3, g3, bl3)) ||$$

$$\Delta X = MAX\Delta G(r3, g3, bl3)) ||$$

$$\Delta X = MAX\Delta B(r3, g3, bl3)), \text{ for all}(r, g, b)\}$$

where x3=LINCUBTBL [x] and MAXΔX (i, j, k) denotes the X component output from table MAXΔ at lookup address (i,j,k). If NEAR=0, set NEAR=0.0005.
Compute the parameter RANGE:
   RANGE=(int) ((MAXVAL+2*NEAR)/(2*NEAR+1))+1;
Compute the parameters
   qbpp=(int)(log[RANGE]+1),
   bpp=max(2,(int)(log(MAXVAL+1)+1), and
   LIMIT=2*(bpp+max(8,bpp)).
NOTE—The parameters NEAR, LUTRES, the tables MAXΔ=(MAXΔR, MAXΔG, MAXΔBL) and the table LINCUBTBL must be added to the compressed file header with specifications similar to those described in Annex C.2.4.

In prediction correction step A.4.2, let Figure A.6 read:

For X=R, G, B:
  Cx=MAXΔX [LINCUBTBL [Pr]][LINCUBTBL [Pg]]
    [LINCUBTBL [Pb]];
    if (SIGN==+1)
      Px=Px+C[Q]*Cx;
    else
      Px=Px−C[Q]*Cx;
    if (Px>MAXVAL)
      Px=MAXVAL;
    else if (Px<0)
      Px=0;

In error quantization step A.4.4, the quantization is based on a non-uniform quantization and not on the uniform quantization used in the Draft International Standard DIS14495-1 (JPEG-LS) (referenced above). Let Figure A.8 read:

tR=MAXΔR [LINCUBTBL [Pr]][LINCUBTBL [Pg]]
    [LINCUBTBL [PbI]];
  tG=MAXΔG [LINCUBTBL [Pr]][LINCUBTBL [Pg]]
    [LINCUBTBL [PbI]];
  tBL=MAXΔL [LINCUBTBL [Pr]][LINCUBTBL [Pg]]
    [LINCUBTBL [PbI]];
  uR=MAXΔR [LINCUBTBL [Ir]][LINCUBTBL [Ig]]
    [LINCUBTBL [IbI]];
  uG=MAXΔG [LINCUBTBL [Ir]][LINCUBTBL [Ig]]
    [LINCUBTBL [IbI]];
  uBL=MAXΔBL [LINCUBTBL [Ir]][LINCUBTBL [Ig]]
    [LINCUBTBL [IbI]];
  For X=R,G,B, compute:
  REM=Errval % tX;
  S=(abs(REM)<uX/2||
    abs (tX−REM)<uX/2)
  if (~S)

```
{
  qErrval = (int) (Errval/NEAR + 0.5);
  Errval = qErrval;
  Rx = Px + SIGN * Errval + NEAR;
  goto ExceptionModeProcessing;
}
else
{
  qErrval = (int) (Errval/tX + 0.5);
  Errval = qErrval;
  Rx = Px + SIGN*Errval*tX;
  if (Rx > MAXVAL)
    Rx = MAXVAL;
  else if (Rx < 0)
    Rx = 0;
}
```

The Boolean statement S is true if the value of x can be obtained with error less than uX/2, by adding an integral number of intervals of size tX to Px. If S is true RegularModeProcessing continues else ExceptionModeProcessing is invoked, ExceptionModeProcessing is described below with reference to section A.5.4 to be added to the Draft International Standard DIS14495-1 (referenced above).

In error mapping step A.5.2, since this is inherently a nearly lossless procedure, let Fig. A.11 read:

if (Errval>=0)
    MErrval=2*Errval+1;
  else
    MErrval=−2*Errval−1;

Add section A.5.4 as follows:
A.5.4 ExceptionModeProcessing
If the Errval computed in A4.4 is larger than the quantization interval associated with the actual value Ix, the residual Errval is coded where Errval is the integral number of minimal-sized intervals between Px and Ix. The encoding is performed as follows:
  a. Compute the value Merrval as described in the corrected figure A.11 in step A.5.2 above.
  b. Compute a second "escape code" different to the escape code used for the limited length Golomb code LG(k, limit) where limit is LIMIT-qbpp-1 as described in section A.5.3 of the above standard. The second escape code is LIMIT-qbpp encoded in unary representation, i.e., LIMIT-qbpp zeros followed by a one.
  c. Append the escape code followed by the value MErrval-1 in binary representation to the encoded bit stream. RegularModeProcessing is then resumed for the next pixel location, without performing update variables step A.6.

In update step A.6.1 let the first line Figure A.12 be replaced by the following:
  if (~S)
    B[Q]=B[Q]+Errval*NEAR,
  else
    B[Q]=B[Q]+Errval*tX;

In run scanning step A.7.1, let Fig. A.14 read:
  RUNval=Ra;
  RUNcnt=0;
  while (abs(Ix−RUNval)<=uX/2)

```
{
  RUNcnt = RUNcnt + 1;
  Rx = RUNVal;
  if (EOLine == 1)
    break;
  else
    GetNextSample( );
}
```

In run interruption sample encoding step A.7.2, let Fig. A.17 read:
  if (abs(Ra−Rb)<=uX/2)
    RIType=1;
  else if (Rx<0)
    RIType=0;

In run interruption sample encoding step A.7.2, let Fig. A.19 read:
  if (RIType==0 &&(Ra>Rb))

```
{
  Errval = −Errval;
  SIGN = −1
}
else
  SIGN = 1;
```

Errval=Quantize(Errval);
  Rx=ComputeRx(Errval);
  Errval=ModRange(Errval, RANGE);
where Quantize(), ComputeRx() and ModRange() are the revised functions described above.

If ExceptionModeProcessing was invoked in performing Quantize(Errval), the steps following Quantize(Errval) will be skipped, including steps 4–9 of section A.7.2. Regular- ModeProcessing will thus be resumed at the next pixel location. If ExceptionModeProcessing was not invoked in performing Quantize(Errval), steps 4–9 of section A.7.2 are completed as specified in the Draft International Standard DIS14495-1.

An alternate embodiment of a method for decompressing noisy images, compatible with the second embodiment for compressing noisy signals described above, is described with reference to the above mentioned Draft International Standard DIS14495-1 (JPEG-LS), and is as follows:

Perform all the steps described in Annex F of the above mentioned Draft International Standard DIS14495-1 (JPEG-LS), with the changes and additions described below. Where reference is made in Annex F to Annex A, use the revised Annex A described above.

Add step g:

g. Read NEAR, LUTRES, MAXΔ=(MAXΔR, MAXΔG, MAXΔBL) and LINCUBTBL as specified in A.2.1.

Add step 9.c as follows:

c. If the unary code contains LIMIT-qbpp zeros, read an additional qbpp bits to get a binary representation of Merrval.

Correct step 12 to read as follows:

12. If the last unary code read was the code for ExceptionModeProcessing, multiply Errval by NEAR. Else compute tX according to Figure A.8 and multiply Errval by tX.

Correct step 14 to read as follows:

14. Compute Rx=Errval+[Px] modulo M where M=RANGE*NEAR or M=RANGE*tX, depending on the alternative computed in step 12. Clamp Rx to [0 . . . MAXVAL]. This is done as follows:

if (Rx<-M)
   Rx=Rx+RANGE*M;
else
  if (Rx>MAXVAL+M/2)
     Rx=Rx-RANGE*M;
if (Rx<0)
   Rx=0;
else if (Rx>MAXVAL)
   Rx=MAXVAL;

It will be appreciated by persons skilled in the art that the non-uniformly sampled table MAXΔ may be replaced by a uniformly sampled table by simply replacing the function LINCUB [Pr] by the identity function:

LINCUB [Pr]=Pr and the function LINCUBTBL [Pr] by the nearest integer value of Pr, i.e.:

LINCUBTBL [Pr]=(int) (Pr+0.5)

It will also be readily apparent to persons skilled in the art that two cycles of compression and decompression using the above embodiments will result in the second decompressed data being identical to the first decompressed data. This allows multiple compression and decompression cycles without image degradation.

It will be appreciated by persons skilled in the art that the compression and decompression cycle may still result in some posterized areas by the above or other embodiments of the present invention. This posterization may be partially alleviated by including a post processing step wherein a random value is added to each decompressed signal value of the order of amplitude of the original error deviation but small enough not to affect the visual fidelity of the signal. The computation of random noise is effected with the help of a random gaussian deviate generator. Gaussian deviate generators are described in section 7.2 of "Numerical Recipes in C", referenced above. To add noise to the decompressed signal proceed as follows:

Select a factor f less than 1. A useful factor is f=0.25. For each decompressed signal value, X, compute a new value X':

$$X'=X+f*nd*MAXΔX [LINCUBTBL [R]][LINCUBTBL [G]][LINCUBTBL [B]]/2;$$

where nd is a random normal deviate, newly generated for each triplet (R,G,B) and X is R, G or B.

The methods and apparatus detailed above, have been described without reference to specific hardware or software. Rather, the methods and apparatus have been described in a manner sufficient to enable persons of ordinary skill in the art to readily adapt commercially available hardware and software as may be needed to reduce any of the above detailed embodiments to practice without undue experimentation using conventional techniques It will further be appreciated by persons skilled in the art that the methods described above may be implemented by software or software means (data) executable on computing means, such as a CPU, PC, or other similar data processors, microprocessor, embedded processors, microcomputers, microcontrollers etc. The computing means processes the inputted data from apparatus in communication therewith to calculate a desired result. Processing includes performing operations, preferably in the form of algorithms (as detailed above) for performing the above detailed methods of the present invention.

While preferred embodiments of this invention have been described, so as to enable one of skill in the art to practice the present invention, the preceding description is exemplary only. As will be realized, the invention is capable of other and different embodiments and its several details are capable of modifications in various obvious respects, all without departing from spirit and scope of the invention. The scope of the invention should be determined by the following claims.

Appendix A: Non-uniform quantization with noise

Let $Q) = T_i; i=1,...,L+1\}$ be a quantization of the set of possible pixel values $\{s | s = 0,...,2^m - 1\}$ where m is the number of bits obtained from the analog-to-digital converter.

Let $r_i(t) = r(t_i, t_{i+1}) = \frac{t_{i+1} - t_i}{2}$

Suppose $P_s(s)$ is the distribution of signed values in a typical image. Then the quantization that minimizes mean square error of the quantized signal is the set Q that minimizes $$MSE_Q = E[(s - r(t(s)))^2] = \int_{t_i}^{t_{i+1}} (s - r(t(s)))^2 P_s(s) ds$$

where t(s) is the interval containing s, i.e., $t_i < s < t_{i+1}$

It can be shown (Jain, referenced above) that if $P_s(s)$ is the uniform distribution, then the optional mean square quantization is the uniform quantization:

$t_{k+1} = t_k + q$ where $q$ is a constant interval length.

When the signal is noisy, the observed value $x$ is not the signal $s$ but is a random variable distributed about $s$. Let $P_x(x|s)$ be the distribution of $x$ given $s$. Then, the mean square error prior to quantization is:

$$MSE \ (noise) = E_s\left[E_{x|s}\left[(x-s)^2 | s\right]\right] = E_s[variance \ (x|s)]$$

To minimize only the quantization error introduced by Q we will minimize the relative mean square error, as defined below $$\text{Relative MSE}_Q = E_s\left[E_{x|s}\left[\frac{(s-r(t(x))^2}{variance(x|s)}\bigg|s\right]\right]$$

Denoting $g(s) = variance(x|s)$, we get $$\text{Relative MSE}_Q = \int_s \left(\int_{t_i}^{t_{i+1}} \frac{(s-r(t(x)))^2}{g(s)} P_{x|s}(x|s) dx\right) P_s(s) ds$$

$$= \int_s \sum_{i=1}^{L} \left(\int_{t_i}^{t_{i+1}} \frac{(s-r(t(x)))^2}{g(s)} P_{x|s}(x|s) dx\right) P_s(s) ds$$

$$= \sum_{i=1}^{L} \int_{t_i}^{t_{i+1}} \left(\int_s \frac{(s-r(t(x)))^2}{g(s)} P_{x|s}(x|s) P_s(s) ds\right) dx$$

Taking $\frac{\partial \text{Relative MSE}_Q}{\partial t_k} = \frac{\partial \text{Relative MSE}_Q}{\partial r_k} = 0$ we get

P-2093-US $$r_k = \frac{\int_{t_k}^{t_{k+1}} \left( \int_s \frac{s}{g(s)} P_{x|s}(x|s) P_s(s) ds \right) dx}{\int_{t_k}^{t_{k+1}} \left( \int_s \frac{1}{g(s)} P_{x|s}(x|s) P_s(s) ds \right) dx}$$

$$= \frac{E_{s,x}\left[ \frac{s}{g(s)} \Big| x \in [t_k, t_{k+1}) \right]}{E_{s,x}\left[ \frac{1}{g(s)} \Big| x \in [t_k, t_{k+1}) \right]}$$

and, assuming $r_{k-1} < t_k < r_k < t_{k+1}$, $t_k$ satisfies $$\int_s \frac{(s - r_{k-1})^2}{g(s)} P_{x|s}(t_k|s) P(s) ds = \int_s \frac{(s - r_k)^2}{g(s)} P_{x|s}(t_k|s) P(s) ds$$

Since $\frac{P_{x|s}(t_k|s)P(s)}{P(t_k)} = P_{s|t_k}(s|t_k)$ and $P(t_k)$ is independent of $s$, we get:

$$(r_k - r_{k-1}) E_{s|t_k}\left[ \frac{s}{g(s)} \Big| t_k \right] = \frac{r_k^2 - r_{k-1}^2}{2} E_{s|t_k}\left[ \frac{1}{g(s)} \Big| t_k \right]$$

This may be written as:

$$(r_k - r_{k-1}) E_{s|t_k}\left[ \frac{s}{g(s)} \Big| t_k \right] = (r_k - r_{k-1}) \left( \frac{r_k + r_{k+1}}{2} \right) E_{s|t_k}\left[ \frac{1}{g(s)} \Big| t_k \right]$$

i.e $$\frac{r_k + r_{k+1}}{2} = \frac{E_{s|t_k}\left[ \frac{s}{g(s)} \Big| t_k \right]}{E_{s|t_k}\left[ \frac{1}{g(s)} \Big| t_k \right]}$$

APPENDIX B

Let g[s] be the standard deviation of a noise distribution P[x|s] where x is an observation of signal value s. For photon shot noise P is the Poisson distribution and g[s] is s^(1/2). The following procedure computes quantization intervals having the property that each interval length is approximately proportional to the values in the interval.

Assume max{s} = 2^m-1. Then

```
t[1]=1;
r[1]=1;

for (i=0 ; i<L-1 ; i++)
{
        r[i+1] = r[[i]] + g[t[i]];
        t[i+1] = t[[i]] + g[r[i]];
}
t[L]=t[L-1]+g[r[L-1]];

for (i=0 ; i<=L ; i++)
        t[i] = (t[i]-1)*(2^m-1)/(t[L+1]-1);

for (i=0 ; i<L ; i++)
        r[i] = (t[i+1]+t[i])/2;
```

The choice of R[1] is arbitrary and has a significant effect only on the initial intervals with a decreasing effect on distant intervals. Experience indicates a value of 1 to provide good results.

Alternatively the quantization can be explicitly computed using the solution to the differential equation $$\frac{df(x)}{dx} = c\sqrt{x} \qquad (8)$$

The solution $f(x) = c_1 x^{3/2} + c_2$ leads to:

$$d = \frac{(\max\{s\})^{2/3}}{L}$$
$$t[k] = (kd)^{3/2} \qquad 0 \le k \le L \qquad (9)$$
$$r[k] = \frac{t[k]+t[k-1]}{2} \qquad 1 \le k \le L-1$$

The final number of quantization levels may be smaller since for small k, the interval size may be less than 1. In this case concatenate adjacent intervals to size at least 1.

Appendix C

Simulation tests for optimal quantization of image data containing Poisson noise Suppose the value measured at a pixel site is a random variable X with specific observation x. X has a discrete distribution depending on the frequency distribution P(S) of the actual signal S that might have caused observation x.

P(X=x) = Sum[ P(X=x | S=s) * P(S=s)]

Suppose P(X=x | S=s) = Poisson(x,s+α) = (s+α)^x e^-(s+α) /x!
where α is a parameter depending on the size of dark current in the sensor and s is the true signal value, proportional to the incident light level.

P(X=x , S=s) = Poisson(x, s+α)*P(S=s)

P(S=s | X=x)  = (P(X=x | S=s)*P(S=s)) / P(X=x)
             = (Poisson(x, s+α)*P(S=s))/Sum[ P(X=x | S=s) * P(S=s)]

We wish to minimise RELATIVE mean square error when quantizing x to r where r(i) is approximately defined by t(i) = (r(i) + r(i+1))/2 and {t(1),......,t(L+1)} are the L+1 quantization level boundaries.

Relative MSE = E[(s-r(x(s)))^2/(E[(x-E(x|s))^2]|s] =
             Sum[ Sum[((s-r(x(s)))^2/ E[(x-E(x|s))^2|s] )P(X=x | S=s)] P(S=s) ]

Suppose P(S) is uniform, i.e. P(S=s) =(1/2^m) where the range of X and S is [0,2^m]

The following *Mathematica* computations simulate the minimization of the relative mean square error with respect to uniform quantization Q={t(1),...t(L+1)} in an exponent space, as described with reference to Fig. 3 above. It is assumed that there is a uniform signal distribution and a Poisson noise distribution. Mathematica is a software package available from Wolfram Research,Champaign, Illinois, USA.

The heuristically chosen exponent space is defined by the image of a function f(s) = s^exp. We show by way of simulation in a typical case that the exponent 1.5 is a local minimum among function transformations f(s) = s^exp and that this provides a better quantization than the uniform quantization (exp=1.0) given uniform signal distribution and a Poisson noise distribution.

```
(* Assume Poisson distribution of noise *)
Poisson[x_,mu_]=mu^x Exp[-mu]/Factorial[x];

(* Probability distribution of X given S *)
probXEqualsxGivens[x_,s_]:=Poisson[x,s+alpha];

(* Uniform probability distribution of S *)
probSEqualss[s_]:= 1/2^Nbits;

Nbits=7;
maxLevel=2^Nbits-1;            (* Range = [0,127] *)
nIntervals=8;
```

```
equalSizeInterval=2^Nbits/nIntervals;
alpha=0.01;
```

1.  ```
    Do[(
    r=Table[N[((i-0.5)*equalSizeInterval)^(pwr/10)/
        (maxLevel+1)^(pwr/10)]*(maxLevel),{i,1,nIntervals}];
    (*
        This can be written ((s/maxLevel)^exp)*NormalizationFactor
        and embodies the exponent space described above
    *)
    t=Table[0,{i,1,nIntervals+1}];
    t[[1]]=0;
    t[[nIntervals+1]]=maxLevel;
    Do[(t[[i]]=(r[[i-1]]+ r[[i]])/2),{i,2,nIntervals}]
    Print["Quantization for equal intervals in x^",N[pwr/10]];
    Print[t];
    mseQuant = Table[0,{i,1,nIntervals}];
    Do[
            (Do[sumFors = 0;
                (Do[(sumFors=N[sumFors]+(N[(s-(t[[i]]+t[[i+1]])/2)^2]/
                        (s+alpha))*N[probXEqualsxGivens[x,s-1]]),
                        {x,t[[i]],t[[i+1]]}];
                    mseQuant[[i]]=mseQuant[[i]]+N[sumFors] *
                            N[probSEqualss[s-1]]),{s,1,maxLevel+1}
                ];
                Print[StringForm["Relative MSE for interval ``: ``",
                        i,mseQuant[[i]]]]),
                {i,1,nIntervals}
            ];
            Print[StringForm["Total Relative MSE: ``",
                N[Sum[mseQuant[[i]],{i,1,nIntervals}]]]]),
    {pwr,10,18}];
    ```

```
Quantization for equal intervals in x^1.
{0, 15.875, 31.75, 47.625, 63.5, 79.375, 95.25, 111.125, 127}
Relative MSE for interval 1:  0.804124
Relative MSE for interval 2:  0.231471
Relative MSE for interval 3:  0.188339
Relative MSE for interval 4:  0.170334
Relative MSE for interval 5:  0.16035
Relative MSE for interval 6:  0.153475
Relative MSE for interval 7:  0.131439
Relative MSE for interval 8:  0.0737429
Total Relative MSE:  1.91327
Quantization for equal intervals in x^1.1
{0, 13.0788, 27.7359, 43.2418, 59.2986, 75.7724, 92.5843, 109.682, 127}
Relative MSE for interval 1:  0.535079
Relative MSE for interval 2:  0.217872
Relative MSE for interval 3:  0.195581
Relative MSE for interval 4:  0.192263
Relative MSE for interval 5:  0.177997
Relative MSE for interval 6:  0.16883
Relative MSE for interval 7:  0.159073
```

Relative MSE for interval 8: 0.0855201
Total Relative MSE: 1.73221
Quantization for equal intervals in x^1.2
{0, 10.7982, 24.2438, 39.2728, 55.3838, 72.3405, 89.9993, 108.263, 127}
Relative MSE for interval 1: 0.321133
Relative MSE for interval 2: 0.202759
Relative MSE for interval 3: 0.203637
Relative MSE for interval 4: 0.197037
Relative MSE for interval 5: 0.180453
Relative MSE for interval 6: 0.185357
Relative MSE for interval 7: 0.177901
Relative MSE for interval 8: 0.0968837
Total Relative MSE: 1.56516
Quantization for equal intervals in x^1.3
{0, 8.93319, 21.2041, 35.6777, 51.7354, 69.0708, 87.4926, 106.868, 127}
Relative MSE for interval 1: 0.202559
Relative MSE for interval 2: 0.186372
Relative MSE for interval 3: 0.188963
Relative MSE for interval 4: 0.202245
Relative MSE for interval 5: 0.200756
Relative MSE for interval 6: 0.203307
Relative MSE for interval 7: 0.197103
Relative MSE for interval 8: 0.110814
Total Relative MSE: 1.49212
Quantization for equal intervals in x^1.4
{0, 7.40422, 18.5563, 32.4205, 48.3348, 65.9555, 85.0616, 105.496, 127}
Relative MSE for interval 1: 0.146148
Relative MSE for interval 2: 0.168951
Relative MSE for interval 3: 0.174106
Relative MSE for interval 4: 0.187283
Relative MSE for interval 5: 0.204068
Relative MSE for interval 6: 0.222915
Relative MSE for interval 7: 0.216843
Relative MSE for interval 8: 0.124302
Total Relative MSE: 1.44462
Quantization for equal intervals in x^1.5
{0, 6.14774, 16.2486, 29.4686, 45.1646, 62.9869, 82.7038, 104.147, 127}
Relative MSE for interval 1: 0.107876
Relative MSE for interval 2: 0.150749
Relative MSE for interval 3: 0.180816
Relative MSE for interval 4: 0.192239
Relative MSE for interval 5: 0.207679
Relative MSE for interval 6: 0.225159
Relative MSE for interval 7: 0.237305
Relative MSE for interval 8: 0.138816
Total Relative MSE: 1.44064
Quantization for equal intervals in x^1.6
{0, 5.11283, 14.2358, 26.7925, 42.2088, 60.1579, 80.4169, 102.82, 127}
Relative MSE for interval 1: 0.0797773
Relative MSE for interval 2: 0.132056
Relative MSE for interval 3: 0.164559
Relative MSE for interval 4: 0.197545
Relative MSE for interval 5: 0.211531
Relative MSE for interval 6: 0.246979

Relative MSE for interval 7: 0.258676
Relative MSE for interval 8: 0.156454
Total Relative MSE: 1.44758
Quantization for equal intervals in x^1.7
{0, 4.25858, 12.4793, 24.3659, 39.4524, 57.4615, 78.1986, 101.516, 127}
Relative MSE for interval 1: 0.057636
Relative MSE for interval 2: 0.113231
Relative MSE for interval 3: 0.148238
Relative MSE for interval 4: 0.203269
Relative MSE for interval 5: 0.236631
Relative MSE for interval 6: 0.249996
Relative MSE for interval 7: 0.281137
Relative MSE for interval 8: 0.173326
Total Relative MSE: 1.46346
Quantization for equal intervals in x^1.8
{0, 3.55203, 10.9455, 22.1649, 36.8816, 54.8914, 76.0467, 100.233, 127}
Relative MSE for interval 1: 0.0394496
Relative MSE for interval 2: 0.0946479
Relative MSE for interval 3: 0.15349
Relative MSE for interval 4: 0.186551
Relative MSE for interval 5: 0.241472
Relative MSE for interval 6: 0.274377
Relative MSE for interval 7: 0.304865
Relative MSE for interval 8: 0.191309
Total Relative MSE: 1.48616

Appendix D

Let R,G,B be three color channels of source data and $P:(R,G,B) \to (L,a,b)$ a mapping from RGB color space to Lab for color space. In general, (R,G,B) could be any multi component color space such as (C,M,Y,K).

A small change in one component, e.g. $\Delta R$ in R will cause a small change in the mapped value $P(R,G,B)$ to $P(R+\Delta R,G,B)$. Let $\Delta E(\cdot,\cdot)$ be a distance function (metric) in CIELab space. Then, $$D_R(R,G,B) \triangleq \frac{\Delta E(P(R+\Delta R,G,B)-P(R,G,B))}{\Delta R}$$

defines a gradient with respect to R at the image of R via the mapping P. Define $D_G, D_B$ similarly. Then, assuming suitable smoothness constraints on the distance function $\Delta E$, and the mapping P, there exists a monotone increasing function $E(L,a,b)$, such that the gradient of the function E is the metric $\Delta E$ and:

$$D_R(R,G,B) = \frac{\partial E}{\partial L}\frac{\partial L}{\partial R} + \frac{\partial F}{\partial a}\frac{\partial a}{\partial R} + \frac{\partial E}{\partial b}\frac{\partial b}{\partial R} = \frac{\partial E}{\partial R}$$

and similarly for G and B.

A small change in $(R,G,B)$ to $(R+\Delta R, G+\Delta G, B+\Delta B)$ will cause a corresponding change in CIELab space:

(i) $\quad dE = \frac{\partial E}{\partial R}\bigg|_{(R,G,B)} \Delta R + \frac{\partial E}{\partial G}\bigg|_{(R,G,B)} \Delta G + \frac{\partial E}{\partial B}\bigg|_{(R,G,B)} \Delta B$ If there is given a maximum allowed $\Delta E$, we can derive $\Delta R, \Delta G, \Delta B$ that will satisfy given proportional weighing in channels R,G,B. Suppose we allow G to have p times the error of R and R to have q times the error of B. Then, form the following equations:

(ii) $\quad \Delta R = p\Delta G$ (iii) $\quad \Delta R = q\Delta B$ and solve for $\Delta R, \Delta G, \Delta B$ in terms of $dE$.

$$\Delta R = dE \bigg/ \left( \frac{\partial E}{\partial R} + \frac{1}{p}\frac{\partial E}{\partial G} + \frac{1}{q}\frac{\partial E}{\partial B} \right)$$

$$\Delta G = dE \bigg/ \left( p\frac{\partial E}{\partial R} + \frac{\partial E}{\partial G} + \frac{p}{q}\frac{\partial E}{\partial B} \right)$$

$$\Delta B = dE \bigg/ \left( q\frac{\partial E}{\partial R} + \frac{q}{p}\frac{\partial E}{\partial G} + \frac{\partial E}{\partial B} \right)$$

The weighting function may be dependent on R,G,B or, equivalently, on Lab, i.e.

$$p = p(R,G,B) \quad \text{or} \quad p = p(L,a,b) = p(P(R,G,B))$$

and similarly for q.

What is claimed is:

1. A method for quantizing a signal having a signal dependent noise distribution, said method comprising the steps of:

establishing a plurality of quantization levels, each of said quantization levels comprising left, right and representative values, and an interval length defined by the difference between said right and left values, such that at least one interval length is different from at least one other interval length; and adjusting said left, right and representative values for each of said quantization levels such that for each of said intervals, said interval length is correlated with said signal dependent noise distribution at said representative value.

2. The method of claim 1, wherein said signal dependent noise is selected from the group consisting of: photon shot noise, dark current shot noise, or combinations thereof.

3. The method of claim 1, wherein said signal dependent noise is a nonlinear transformation of photon shot noise and dark current shot noise.

4. The method of claim 1, wherein said left, right and representative values are determined by simultaneously solving a set of equations, said equations comprising:

$$r_k = \frac{\int_{t_k}^{t_{k+1}} \left( \int_s \frac{s}{g(s)} P_{x|s}(x|s) P_s(s) ds \right) dx}{\int_{t_k}^{t_{k+1}} \left( \int_s \frac{1}{g(s)} P_{x|s}(x|s) P_s(s) ds \right) dx}$$

$$= \frac{E_{s,x}\left[\frac{s}{g(s)} \mid x \in [t_k, t_{k+1})\right]}{E_{s,x}\left[\frac{1}{g(s)} \mid x \in [t_k, t_{k+1})\right]}$$

and $$\frac{r_k + r_{k+1}}{2} = \frac{E_{s|t_k}\left[\frac{s}{g(s)} \mid t_k\right]}{E_{s|t_k}\left[\frac{1}{g(s)} \mid t_k\right]}$$

where $t_k$, $t_{k+1}$, $r_k$ are said left, right, and representative values for the k'th interval of said plurality of intervals and g(s) is the variance of said signal dependent noise at signal value s.

5. The method of claim 1, additionally comprising the step of:

quantizing a difference between a first signal value and a second signal value having the same signal dependent noise distribution, said quantization including the steps of:
computing the difference d between the first and second signals; and
dividing said difference d by the lengths of the interval containing said first signal to obtain the quantized difference Qd; and replacing said difference d with said quantized difference Qd.

6. A method for quantizing a signal having a signal dependent noise distribution, said method comprising the steps of:

establishing a plurality of quantization levels, each of said quantization levels comprising left, right and representative values, and an interval length defined by the difference between said right and left values; and computing said left, right and representative values for each of said quantization levels such that each pair of said successive intervals is in accordance with the relation:

$$(T(k+1)-T(k))/(T(k)-T(k-1))=g[R[k]]/g[R[k-1]]$$

where:
g[s] is the standard deviation of the noise distribution for signal amplitude s;
R[i], i=1, . . . , L are said representative values; and
T[i], T[i+1] i=1, . . . , L are said left and right values corresponding to said representative value R[i].

7. The method of claim 6, wherein said signal dependent noise is selected from the group consisting of: photon shot noise, dark current shot noise, or combinations thereof.

8. The method of claim 7, wherein said signal dependent noise is a non-linear transformation of photon shot noise and dark current shot noise.

9. The method of claim 6, wherein said left, right and representative values are determined by a procedure comprising the steps sf:

determining the standard deviation g[s] of the noise distribution for signal amplitude s;
determining the maximum attainable signal value N;
selecting an exponent e;
setting first left value T[1] equal to 0 and last right value T[L+1] equal to N; and computing values for T[i] and R[i] according to the formulas:

$$R(i) = ((i - 0.5) * (1/L)^{\wedge}(e)) * (N) \quad i = 1, \ldots, L$$

$$T(i) = (R(i) + R(i+1))/2 \quad i = 2, \ldots, L$$

where:
R[i], i=1, . . . , L are said representative values; and
T[i], T[i+1] i=1, . . . , L are said left and right values corresponding to said representative value R[i].

10. The method of claim 6, additionally comprising the step of:

quantizing a difference between a first signal value and a second signal value having the same signal dependent noise distribution, said quantization including the steps of:
computing the difference d between the first and second signals; and
dividing said difference d by the lengths of the interval containing said first signal to obtain the quantized difference Qd; and replacing said difference d with said quantized difference Qd.

11. A method for compressing a signal sequence having a signal dependent noise distribution comprising the steps of:

establishing a plurality of quantization levels, each of said quantization levels comprising left, right and representative values, and an interval length defined by the difference between said right and left values, such that at least one interval length is different from at least one other interval length;

adjusting said left, right and representative values for each of said quantization levels such that for each of said intervals, said interval length is correlated with said signal dependent noise distribution at said representative values;

encoding said representative values and said left and right values for each interval into a bit stream by means of an entropy encoder;

for each signal value S, forming a predicted signal value SP by means of predicted signal values preceding said signal value S in said sequence;

computing the difference d between said predicted signal value; SP and said signal value S;

dividing said difference d by the length ILP of the intervals containing said predicted signal value SP to obtain quantized difference count QDC;

replacing said difference d with said quantized difference count QDC;

encoding said quantized difference QDC into said bit stream by means of an entropy encoder; and saving said bit stream.

12. The method of claim 11, wherein said step of dividing said difference D and replacing said difference D and encoding said quantized difference count QDC are replaced by the steps of:

dividing said difference D by the length ILP of the interval containing said predicted signal value SP to get quantized difference count QDC;

determining the error difference ED between the value SP+QD*ILP and said actual signal value S; and wherein if said difference SP+QDC*ILS is less than a threshold, replacing said difference D with said quantized difference QD and encoding said quantized difference count QDC into a bit stream by means of an entropy encoder, or if said difference SP+QDC*ILS is greater than or equal to said threshold, replacing said difference D with an escape code and actual said value S and encoding said escape code and actual said value S into a bit stream by means of an entropy encoder.

13. The method of claim 12, wherein said threshold is the length ILS of the interval containing said actual signal value S.

14. The method of claim 12, wherein a value approximating actual signal value S is encoded by the steps of:

dividing said difference D by the length ILPS of the interval with the shortest length to get smallest quantized difference count SQDC, and encoding said escape code and said difference count SQDC into a bit stream by means of an entropy encoder.

15. A method for quantizing the differences D between components of a first tuplet of color component values T1 and a second tuplet of color component values T2 from a first multi-component color space MCS1, using a mapping from said space MCS1 to a second multi-component color space MCS2 and a measure of distance DM2 in said space MCS2, said distance measure having a tuplet of gradients DM2DC with respect to the component directions in space MCS2, comprising the steps of;

selecting a distance threshold DELTA2 in said space MCS2;

selecting a tuplet of weighting coefficients W for each component of said space MCS1, mapping said tuplet T1 to said space MCS2 with said mapping from said space MCS1 to said space MACS2 to obtain tuplet T1 in M2;

for each component in said space MCS2, evaluating the tuplet of gradients DM2DC of said measure of distance DM2 in space MCS2 with respect to each component direction in MCS2 at said tuplet T1 in M2;

for each component in said space MCS1, evaluating the tuplet of gradients DT2DT1 of said mapping of space MCS1 with respect to each component direction in MCS2 at said tuplet T1;

computing the scalar product SP2 of said tuplets DT2DT1 with said gradients DM2DC, establishing a tuplet QL of quantization lengths for the component directions in MCS1 such that the ratios R between all pairs of lengths in said tuplet QL is equal to the ratios between the corresponding pairs of weighting coefficients in said tuplet W;

computing the scalar product SP1 of said products SP2 from each component direction in MCS1 space with said tuplet QL;

adjusting said tuplet QL to obtain adjusted tuplet QL' such that said scalar product SP1 is equal to said DELTA2 and said ratios R are unchanged;

dividing each component of said differences D by the corresponding component of said adjusted tuplet QL' to obtain a tuplet of nearest integral values INT;

multiplying said tuplet of nearest integral values INT with corresponding components of said adjusted tuplet QL' to obtain quantized differences QD; and replacing differences D with quantized differences QD.

16. The method of claim 15, wherein said weighting tuplet W varies according to the value of said tuplet T2.

17. The method of claim 15, wherein said second multi-component space is CIELab.

18. The method of claim 15, wherein said second multi-component space is a mathematical one-to-one transformation of CIELab space.

19. The method of claim 15, wherein said mapping from said space MCS1 to a second multi-component color space MCS2 is an ICC profile.

20. A method for compressing a color signal sequence in a first multi-component color space MCS1, having a mapping to a second multi-component color space MCS2 and a measure of distance D2 in said space MCS2, comprising the steps of:

selecting a distance threshold DELTA2 in said space MCS2;

selecting a tuplet of weighting coefficients W for each component of said space MCS1;

encoding said DELTA2 and said W into a bit stream by means of an entropy encoder;

for each multi-component signal tuplet S in said color signal sequence:

forming a predicted signal tuplet PST of an actual signal tuplet T by means of already coded signal tuplets preceding said actual signal tuplet T in said sequence;

computing the differences D between the predicted signal tuplet PST and the actual signal tuplet T;

mapping said tuplet PST to said space MCS2 with said mapping from said space MCS1 to said space MCS2 to obtain tuplet PSTinM2; for each component in said space MCS2:

evaluating the tuplet of gradients DM2DC of said measure of distance DM2 in space MCS2 with respect to each component direction in MCS2 at said tuplet PSTinM2;

for each component in said space MCS1:

evaluating the tuplet of gradients DT2DT1 of said mapping of space MCS1 with respect to each component direction in MCS2 at said tuplet T1;

computing the scalar product SP2 of said tuplets DT2DT1 with said gradients DM2DC, establishing a tuplet QL of quantization lengths for the component directions in MCS1 such that the ratios R between all pairs of lengths in said tuplet QL is equal to the ratios between the corresponding pairs of weighting coefficients in said tuplet W;

computing the scalar product, SP1 of said product SP2 from each component direction in MCS1 space with said tuplet QL;

adjusting said tuplet QL to obtain adjusted tuplet QL' such that said scalar product SP1 is equal to said DELTA2 and said ratios R are unchanged;

dividing each component of said differences D by the corresponding component of said adjusted tuplet QL' to obtain a tuplet of nearest integral values INT;

encoding said tuplet of nearest integral values INT into a bit stream by means of an entropy encoder, and saving said bit stream.

21. The method of claim 20, wherein said step of encoding said tuplet of nearest integral values INT into a bit stream by means of an entropy encoder, is replaced by the steps of:

for each component in MCS1:

computing the error difference ED between said QL' and said QL;

if said difference ED is less than the corresponding component of said tuplet QL of quantization lengths, encoding the component of said tuplet of nearest integral values INT into a bit stream by means of an entropy encoder;

if said difference ED is greater than or equal to the corresponding component of said tuplet QL of quantization lengths, replacing the component of said tuplet of nearest integral values INT with an escape code and the component of said actual signal S; and encoding said escape code and said component of said signal tuplet S into a bit stream by means of an entropy encoder.

22. The method of claim 21, wherein said step of encoding said tuplet of nearest integral values INT into a bit stream by means of an entropy encoder, is replaced by the steps of:

for each component in MCS1:

computing the error difference ED between said QL' and said QL;

if said difference ED is less than the corresponding component of said tuplet QL of quantization lengths, encoding the component of said tuplet of nearest integral values INT into a bit stream by means of an entropy encoder;

if said difference ED is greater than or equal to the corresponding component of said tuplet QL of quantization lengths, dividing said difference D by a predetermined shortest length MIND to obtain said tuplet of nearest integral values INT, and encoding said escape code and the component of said tuplet of nearest integral values INT into a bit stream by means of an entropy encoder.

* * * * *

UNITED STATES PATENT AND TRADEMARK OFFICE
CERTIFICATE OF CORRECTION

PATENT NO.   : 6,396,422 B1
DATED        : May 28, 2002
INVENTOR(S)  : Barkan, Stanley It is certified that error appears in the above-identified patent and that said Letters Patent is hereby corrected as shown below:

<u>Title page,</u>
Add:
-- [30] Foreign Application Priority Data

June 9, 1999 [IL]   Israel…………………..130400 --

Signed and Sealed this

Fifth Day of November, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO.     : 6,396,422 B1
DATED          : May 28, 2002
INVENTOR(S)    : Barkan, Stanley It is certified that error appears in the above-identified patent and that said Letters Patent is hereby corrected as shown below:

Column 1,
Line 21, please replace "where signal" with -- where the signal --.
Line 58, please replace "non-lineally" with -- non-linearly --.

Column 4,
Line 4, please replace "dependent: noise" with -- dependent noise --.
Line 51, please replace "generated by. undesired" with -- generated by undesired --.
Line 61, please replace "a which" with -- α which --.

Column 5,
Line 65, please replace "connection CIELab." with -- connection space CIELab.--.

Column 6,
Line 11, please replace "Conventional" with -- conventional --.

Column 7,
Line 54, please replace "intervals" with -- interval --.

Column 8,
Lines 6 and 10, please replace "T1-in M2" with -- T1_in_M2 --.

Column 9,
Line 30, please replace "DETAILED DESCRIPTION OF THE DRAWINGS" with -- DETAILED DESCRIPTION OF PREFERRED EMBODIMENTS --.
Line 50, please replace the first integral with:

$$r_k = \frac{\int_{t_k}^{t_{k+1}} \left( \int_s \frac{s}{g(s)} P_{x|s}(x|s) P_s(s) ds \right) dx}{\int_{t_k}^{t_{k+1}} \left( \int_s \frac{1}{g(s)} P_{x|s}(x|s) P_s(s) ds \right) dx} = \frac{E_{s,x}\left[\frac{s}{g(s)} \big| x \in [t_k, t_{k+1}]\right]}{E_{s,x}\left[\frac{1}{g(s)} \big| x \in [t_k, t_{k+1}]\right]}$$

UNITED STATES PATENT AND TRADEMARK OFFICE
CERTIFICATE OF CORRECTION

PATENT NO. : 6,396,422 B1
DATED : May 28, 2002
INVENTOR(S) : Barkan, Stanley

It is certified that error appears in the above-identified patent and that said Letters Patent is hereby corrected as shown below:

Column 11,
Line 15, please replace "table by" with -- table QLUT by --.
Line 23, please replace "[i]=0;" with -- QLUT[i]=0; --.
Line 27, please replace "[i]=R[j]" with -- QLUT[i]=R[j] --.
Line 36, please replace "p[i][j]=[p[i][j]]" with -- p[i][j]=QLUT[p[i][j]] --.

Column 13,
Line 66, please replace "a so be" with -- also be --.

Column 14,
Line 11, please replace "Initial" with -- initial --.

Column 15,
Line 13, please replace "the MAXVAL+1" with -- QLUT the MAXVAL+1 --.
Line 42, please replace "table as" with -- table QLUT as --.
Line 49, please replace "[i]=0;" with -- QLUT[i]=0; --.
Line 53, please replace "[i]=R[j];" with -- QLUT[i]=R[j] --.

Column 18,
Line 58, please replace "invoke" with -- invoked --.

Column 19,
Line 6, please replace "T. R." with -- T, R, --.
Line 65, please replace "s`s+f*sqrt(s)*nd" with -- s`=s+f*sqrt(s)*nd --.

Column 21,
Line 8, please replace "amplifies" with -- amplify --.
Line 26, please replace "(LP(r+8,g,b1)-LP(r,g,bl) 8)*" with
-- "(LP(r+8,g,bl)-LP(r,g,b1))* --.
Line 28, please replace "(aP(r+6,g,bl)-aP(r,g,bl))*" with -- aP(r+8,g,bl)-aP(r,g,bl))* --.
Line 34, please replace "(LP(r,g+8,b#)LP(r,g,bl))*" with --(LP(r,g+8,bl) -LP(r,g,bl))* --.

UNITED STATES PATENT AND TRADEMARK OFFICE
CERTIFICATE OF CORRECTION

PATENT NO. : 6,396,422 B1
DATED : May 28, 2002
INVENTOR(S) : Barkan, Stanley

It is certified that error appears in the above-identified patent and that said Letters Patent is hereby corrected as shown below:

Column 22,
Line 5, please replace "tabls." with -- tables --.
Line 7, please replace "above:" with -- above, using source data x: --.

Column 23,
Line 14, please replace "arithrfetic" with -- arithmetic --.
Line 55, please replace "beer" with -- better --.

Column 24,
Line 58, please replace "the number of bits in a sample" with -- the number of bits in a sample; minimum=8 bits --.
Line 66, please replace "the value)+1; default = 65" with -- The value)+1; default=65; minimum=33 --.

Column 25,
Line 11, please replace "DB(R,G,B)    color (L,a,b) in the direction of L, a and b respectively" with
-- DB(R,G,B)    color (L,a,b) in the direction of R, a and b respectively
   LP(R,G,B), aP(R,G,B)    color mapping from RGB --.
Line 28, please replace "LINGUBTBL" with -- LINCUBTBL --.
Lines 29-47, please change text to:

```
width=pow(MAXVAL,3)/(LUTRES-1);
y=0;
for (x=0; x<MAXVAL; X++)
    {
      temp1 = y * width;
      temp2 = (y+1) * width;
      temp3 = pow(x,3);
      if (temp3-temp2>0)
         {
           y = y+1;
           temp1 = y * width;
           temp2 = (y+1) * width;
         }
      if (abs(temp3-temp1)< abs(temp3-temp2))
        LINCUBTBL[x] = y;
      else
        LINCUBTBL[x] = y+1;

}
```

UNITED STATES PATENT AND TRADEMARK OFFICE
CERTIFICATE OF CORRECTION

PATENT NO.    : 6,396,422 B1
DATED         : May 28, 2002
INVENTOR(S)   : Barkan, Stanley It is certified that error appears in the above-identified patent and that said Letters Patent is hereby corrected as shown below:

<u>Column 26,</u>
Line 40-46, please change text to -- LINCUB(x) = MAXVAL * pow(x/(LUTRES-1),3); --.

<u>Column 29,</u>
Line 46, please replace "LINCUB [Pr]" with -- LINCUB [Xr] --.
Line 48, please replace "LINCUB [Pr]=Pr" with -- LINCUB [Xr]=MAXVAL*9X/(LUTRES-1)) --.

<u>Column 49,</u>
Line 27, please replace the first integral with:

$$r_k = \frac{\int_{t_k}^{t_{k+1}} \left( \int_s \frac{s}{g(s)} P_{x|s}(x|s) P_s(s) ds \right) dx}{\int_{t_k}^{t_{k+1}} \left( \int_s \frac{1}{g(s)} P_{x|s}(x|s) P_s(s) ds \right) dx} = \frac{E_{s,x}\left[ \frac{s}{g(s)} \Big| x \in [t_k, t_{k+1}) \right]}{E_{s,x}\left[ \frac{1}{g(s)} \Big| x \in [t_k, t_{k+1}) \right]}$$

<u>Column 50,</u>
Line 66, please replace "difference d" with -- difference D --.
Line 67, please replace "value; SP" with -- value SP --.

<u>Column 51,</u>
Line 4, please replace "difference d" with -- difference D --.
Line 17, please replace "said actual signal" with -- said signal --.

UNITED STATES PATENT AND TRADEMARK OFFICE
CERTIFICATE OF CORRECTION

PATENT NO. : 6,396,422 B1
DATED : May 28, 2002
INVENTOR(S) : Barkan, Stanley

It is certified that error appears in the above-identified patent and that said Letters Patent is hereby corrected as shown below:

<u>Column 51,</u>
Lines 25 and 26, please replace "actual said value" with -- said signal value --.
Line 29, please replace "said actual signal" with -- said signal --.
Line 32, please replace "Approximating actual signal" with -- Approximating signal --.
Line 54, please replace "MACS2" with -- MCS2 --.
Lines 55 and 59, please replace "T1 in M2" with -- T1inM2--.

Signed and Sealed this

Twenty-fifth Day of February, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,396,422 B1
DATED        : May 28, 2002
INVENTOR(S)  : Barkan, Stanley It is certified that error appears in the above-identified patent and that said Letters Patent is hereby corrected as shown below:

Column 25,
Line 11, please replace "DB(R,G,B) color(L,a,b) in the direction of R, a and b respectively LP(R,G,B), aP(R,G,B) color mapping from RGB" with
-- DB(R,G,B)    color (L,a,b) in the direction of R, a and b resspectively
                LP(R,G,B), aP(R,G,B)   color mapping from RGB
                BP(R,G,B)              space to Lab space --

Column 51,
Line 1, please replace "difference d" with -- difference D --.

Signed and Sealed this

Eleventh Day of November, 2003

JAMES E. ROGAN
*Director of the United States Patent and Trademark Office*